United States Patent
Kothari

[19]

[11] Patent Number: 6,164,596

[45] Date of Patent: Dec. 26, 2000

[54] DESIGNS OF AND METHODOLOGY FOR INWARD OR OUTWARD, AND PARTIALLY INWARD OR OUTWARD TURNING FLOW HYPERSONIC AIR-BREATHING AND ROCKET-BASED-COMBINED-CYCLE VEHICLES

[76] Inventor: Ajay P. Kothari, 1350 Piccard Dr., Suite 320, Rockville, Md. 20850

[21] Appl. No.: 09/048,080

[22] Filed: Mar. 25, 1998

Related U.S. Application Data

[60] Provisional application No. 60/042,397, Mar. 25, 1997.

[51] Int. Cl.$^7$ ...................................................... B64G 1/00
[52] U.S. Cl. ...................................................... 244/158 R
[58] Field of Search ............................ 244/158 R; 703/1, 703/7, 8; 395/500.01, 500.28, 500.29

[56] References Cited

U.S. PATENT DOCUMENTS

| | | |
|---|---|---|
| 2,771,243 | 11/1956 | Wolin et al. . |
| 2,965,977 | 12/1960 | Crabb et al. . |
| 4,173,777 | 11/1979 | Schmit et al. . |
| 5,017,141 | 5/1991 | Relf et al. . |
| 5,092,780 | 3/1992 | Vlach . |
| 5,435,725 | 7/1995 | Ikeuchi . |
| 5,552,984 | 9/1996 | Crandall et al. . |
| 5,847,956 | 12/1998 | Bronfeld et al. . |

OTHER PUBLICATIONS

AIAA 96–2552 Hypersonic Vehicle Design Using Inward Turning Flowfields, Ajay P. Kothari, et al., Astrox Corporation, Rockville, MD, John W. Livingston, ASC/XRED, Wright–Patterson Air Force Base, OH, 32nd AIAA/ASME/SAE/ASEE Joint Propulsion Conference, Jul. 1–3, 1996/Lake Buena Vista, FL.

*Primary Examiner*—Peter M. Poon
*Assistant Examiner*—Tien Dinh
*Attorney, Agent, or Firm*—Lalos & Keegan; Michael N. Lau

[57] ABSTRACT

The present invention is a novel method of designing a space vehicle. Unlike all previous known methods of designing a space vehicle, the present invention relies upon Radial Deviation Parameter to devise the flow field which provides the aero-dynamic effect as well as serving as an energy source to propel the space vehicle. The present invention would provide a single stage to orbit vehicle, which is a noted advancement over the conventional multi-stage to orbit vehicle. Furthermore, the teaching of the Radial Deviation Parameter design method can also be applied to transcontinent flight vehicles.

20 Claims, 43 Drawing Sheets

A New Method for Designing High-Speed Aircrafts and Missiles

New Concept: Radial Deviation Parameter

For Inward Turning Flows RDP > 0

RDP = $(R_o - R_i) / R_o$

For Outward Turning Flows RDP < 0

RDP = $-(R_o - R_i) / R_o$

For Two-dimensional Flows RDP = 0

Figure 1. A New Method for Designing High-Speed Aircrafts and Missiles
New Concept: Radial Deviation Parameter
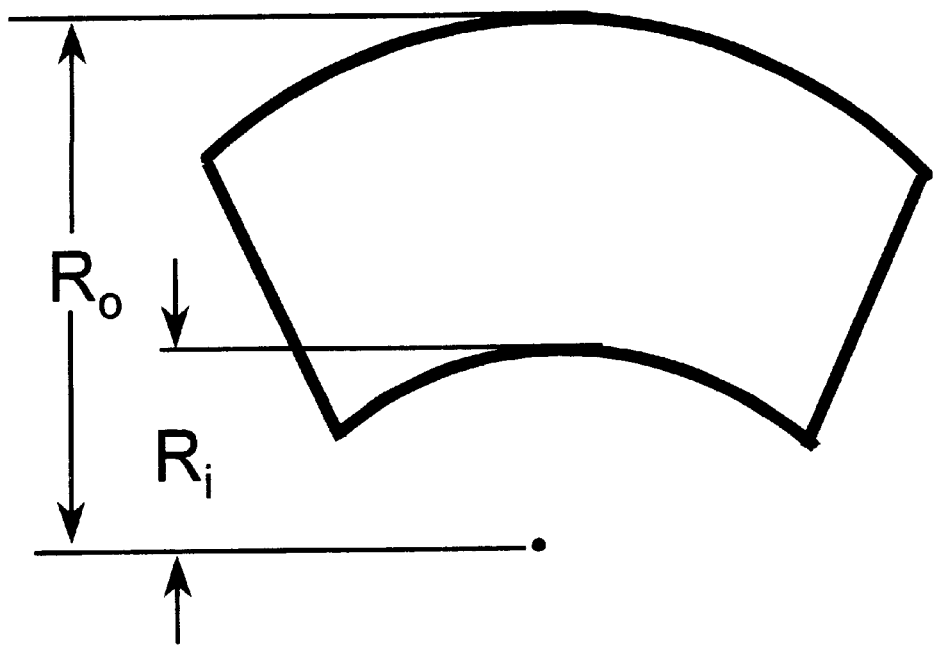
For Inward Turning Flows RDP > 0
$$RDP = (R_o - R_i) / R_o$$
For Outward Turning Flows RDP < 0
$$RDP = -(R_o - R_i) / R_o$$
For Two-dimensional Flows RDP = 0

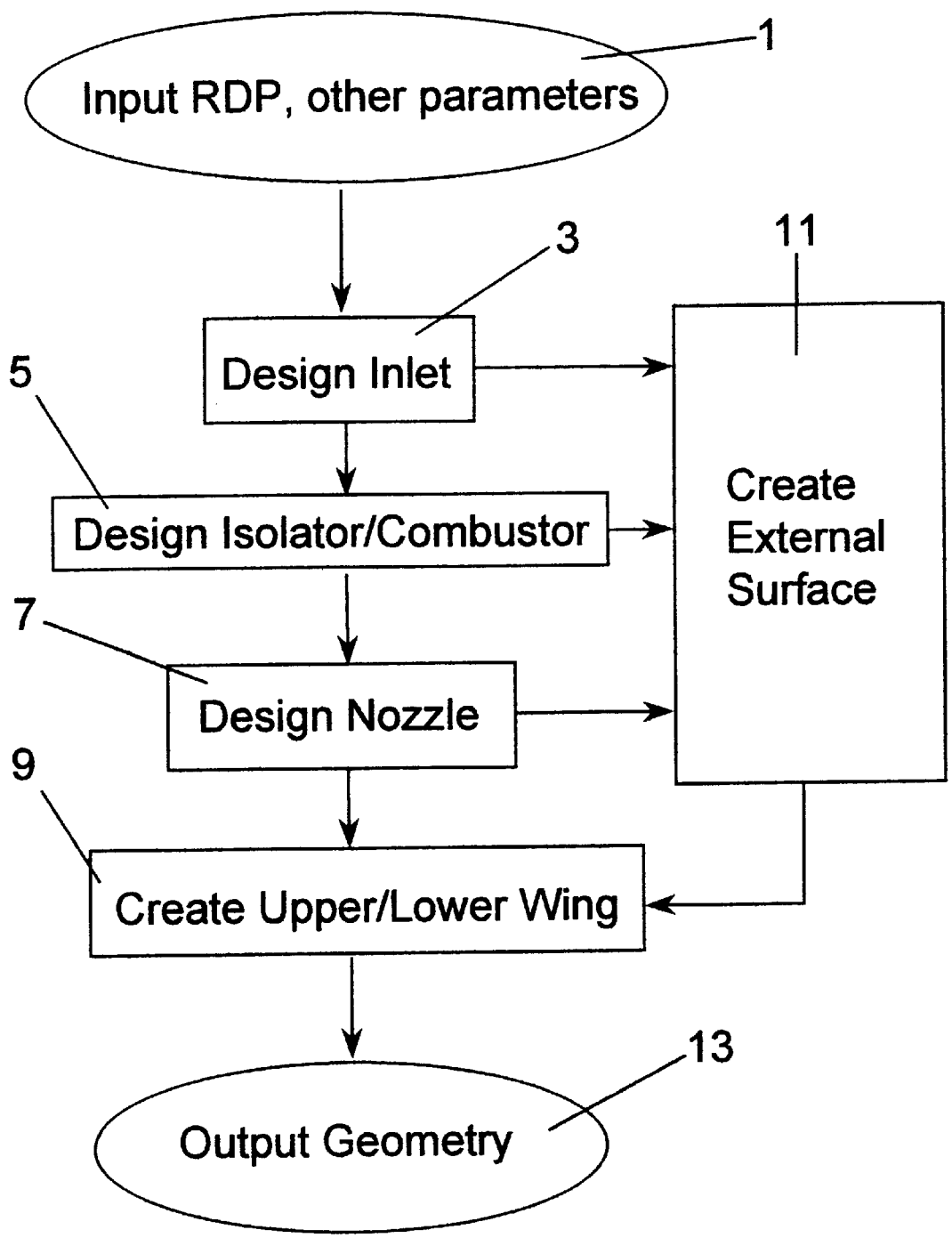
Figure 2. Design Method

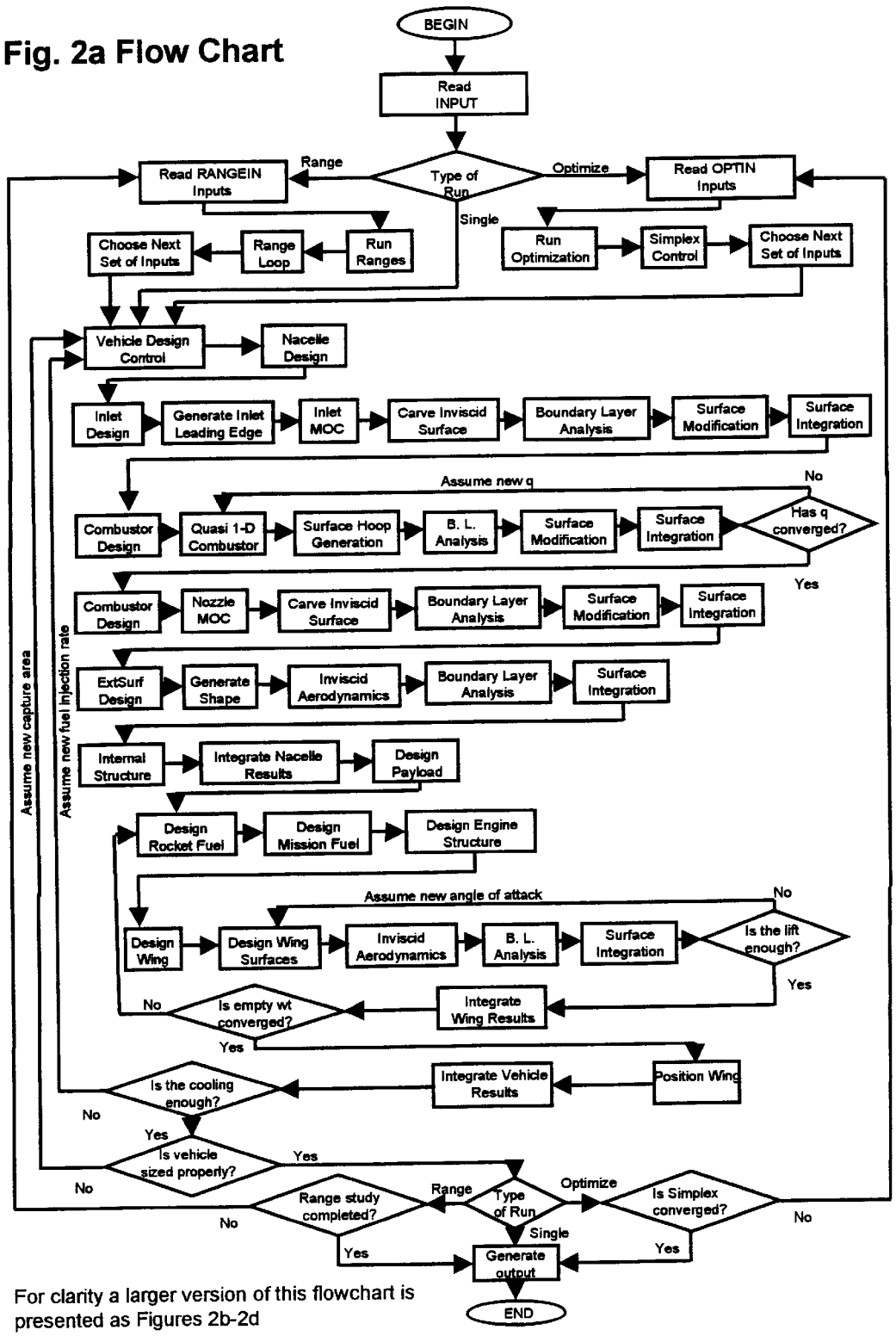
Fig. 2a Flow Chart
For clarity a larger version of this flowchart is presented as Figures 2b-2d

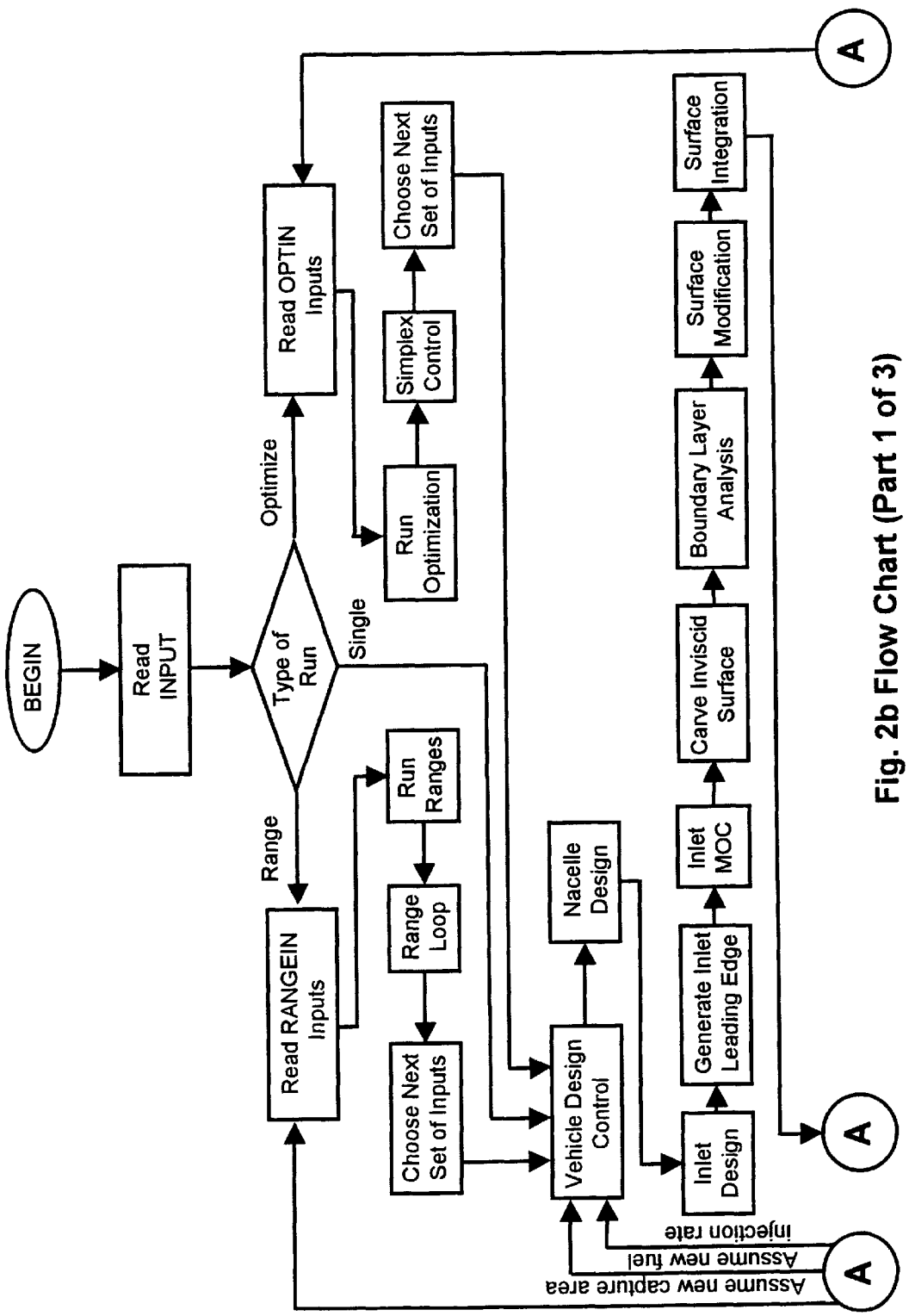
Fig. 2b Flow Chart (Part 1 of 3)

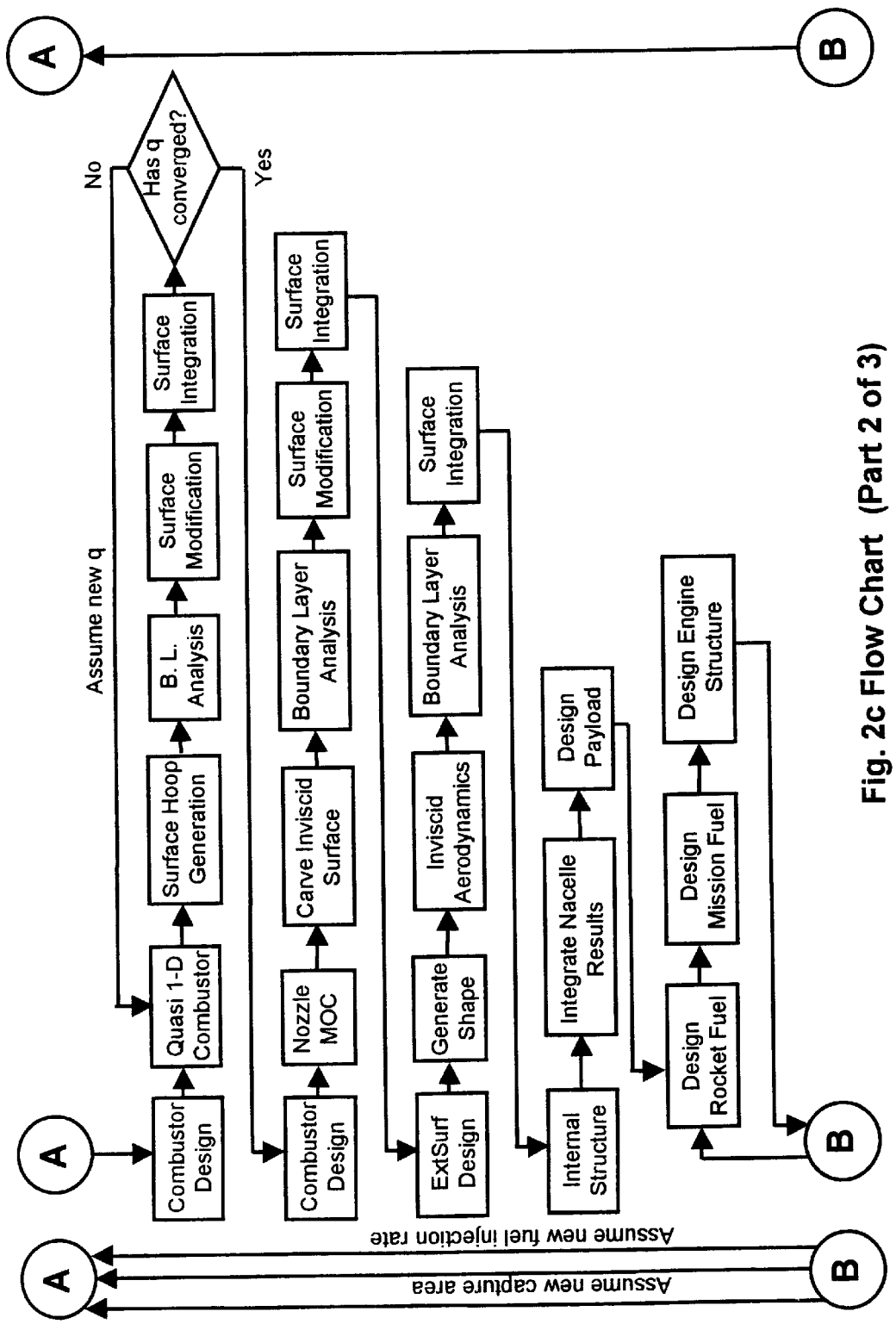
Fig. 2c Flow Chart (Part 2 of 3)

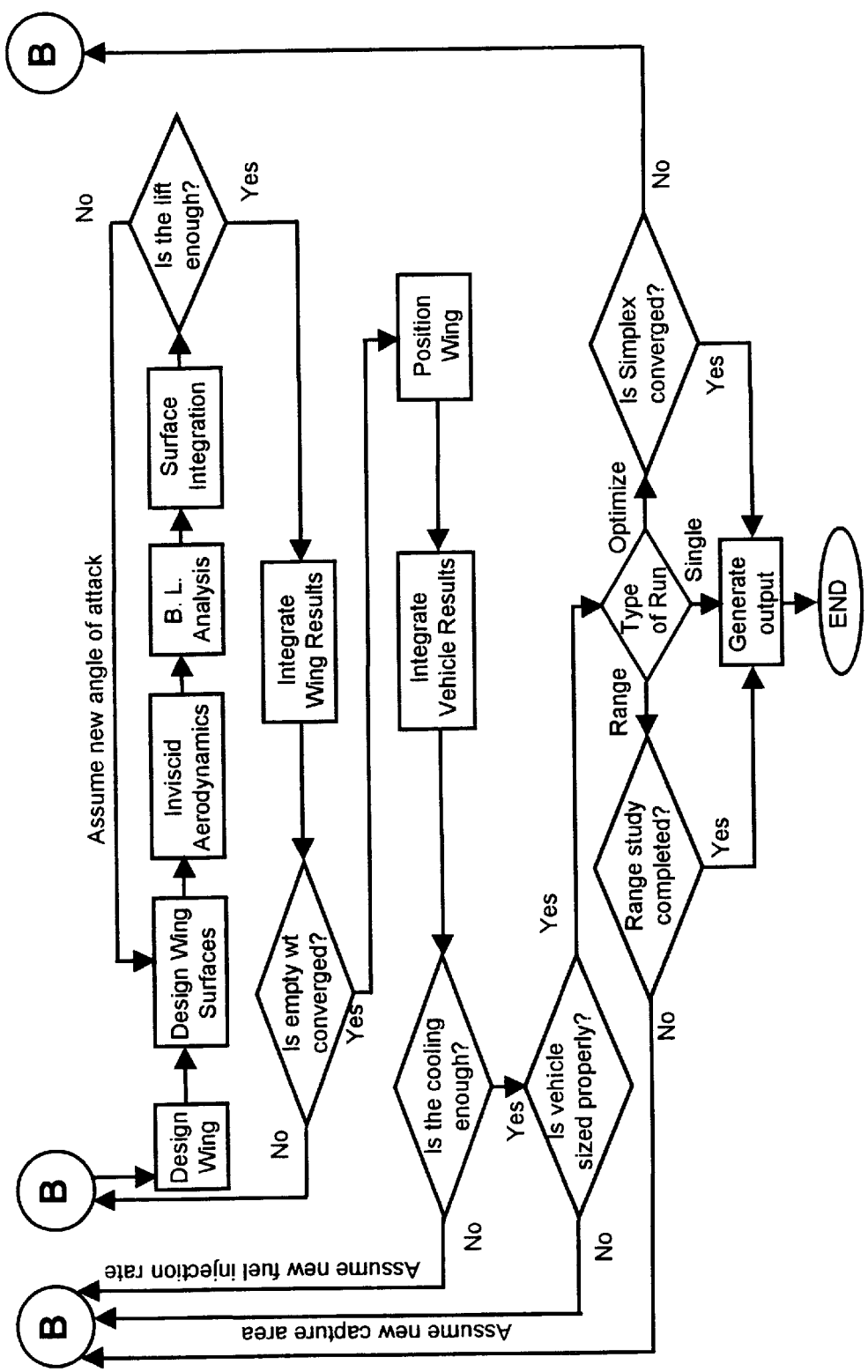
Fig. 2d Flow Chart (Part 3 of 3)

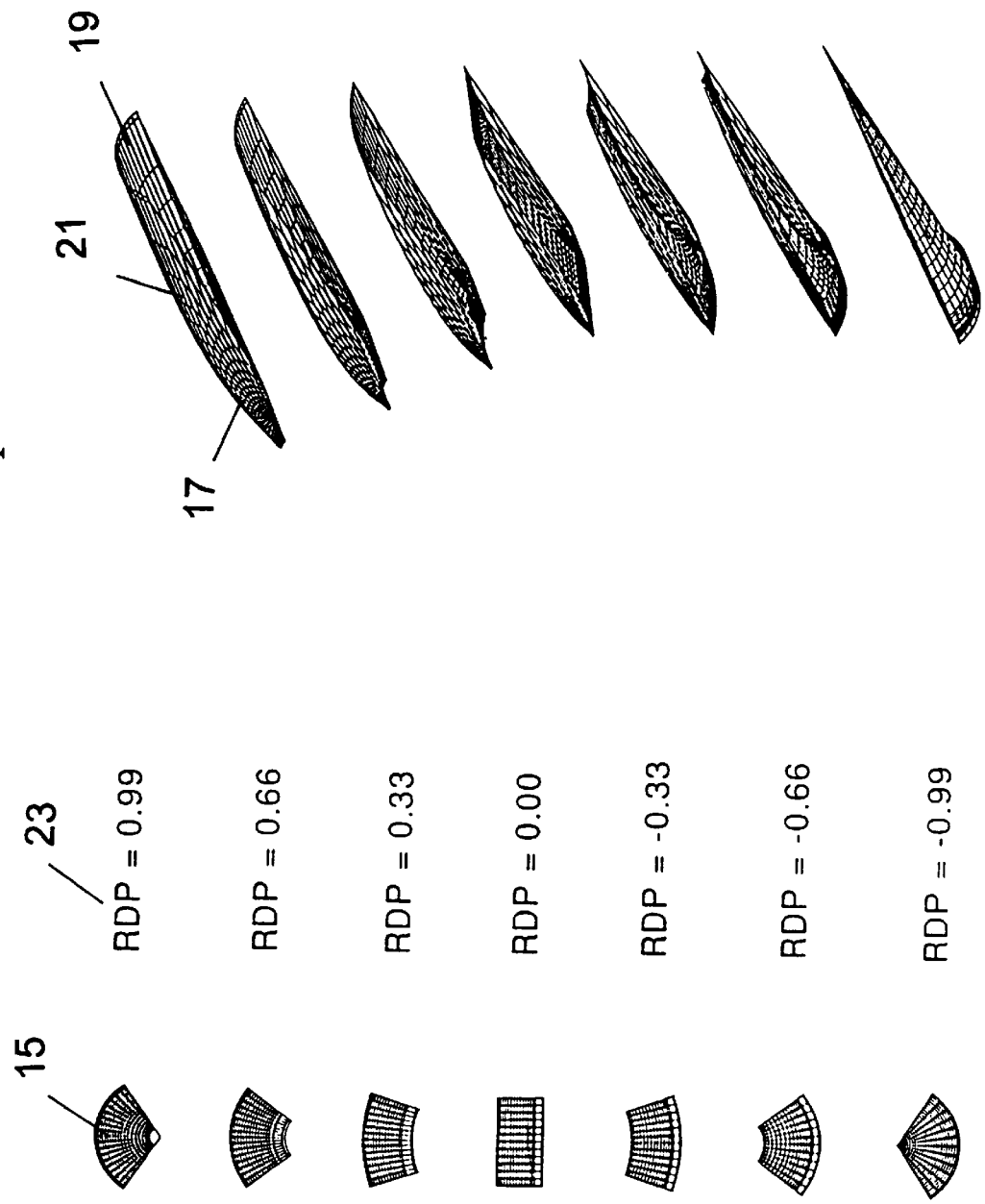
Figure 3 Sample Engine Inlets Created using this Concept

Figure 4
Sample Designs Created Using this Concept
Inward Turning Vehicle
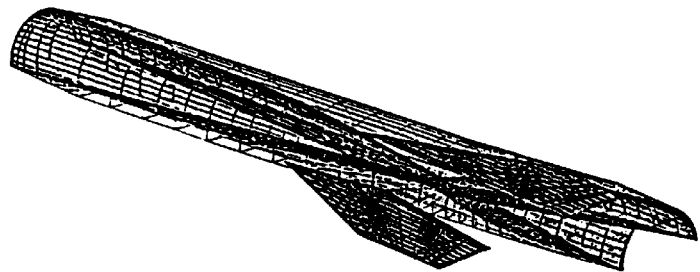
Two-Dimensional Vehicle
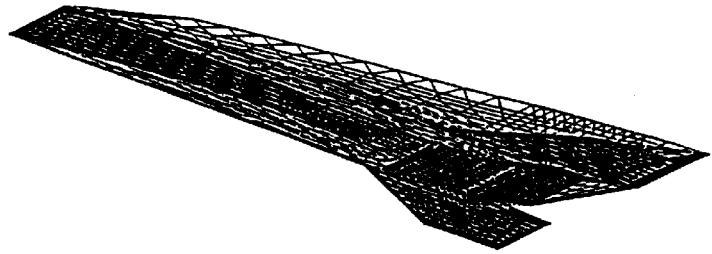
Outward Turning Vehicle
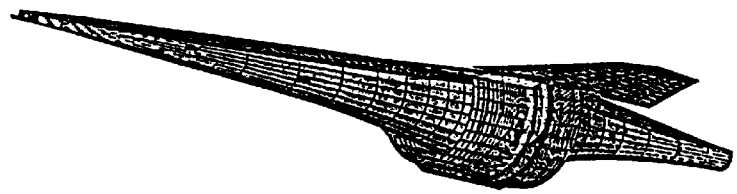

Fig. 8: Combustor with Traversing Cone, at Mach 12 (Design Point)

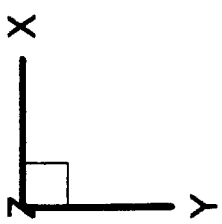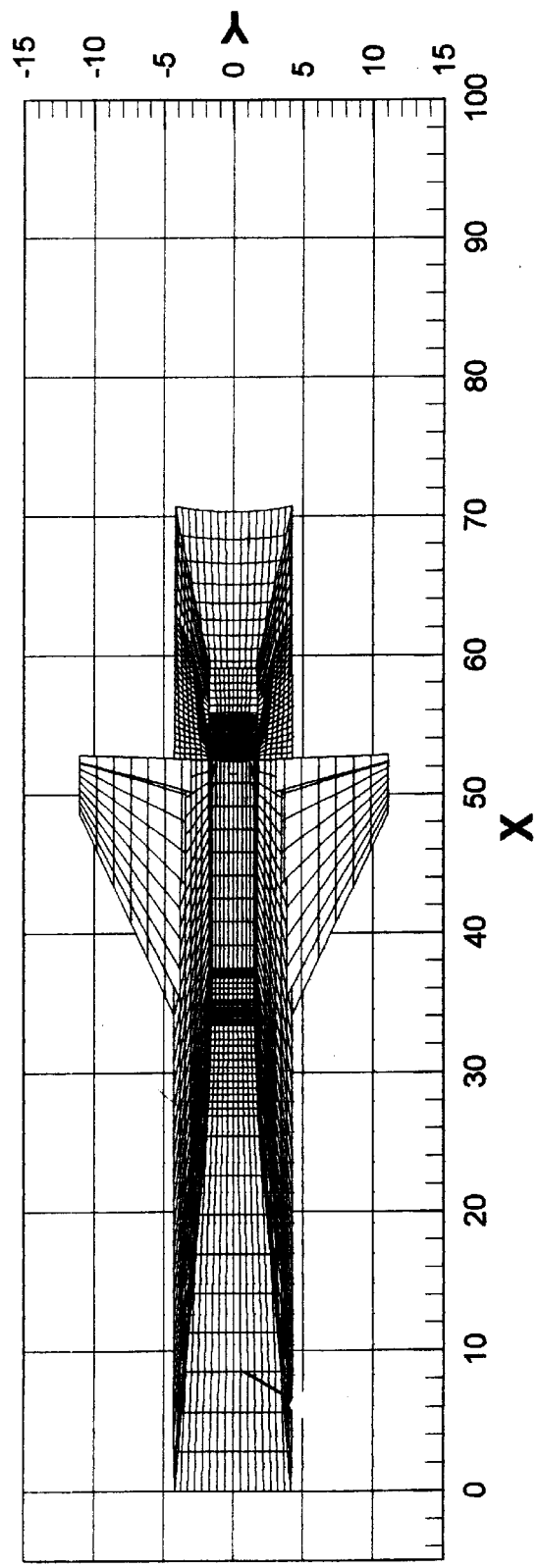
Fig. 12

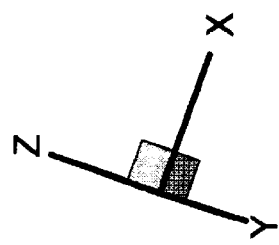
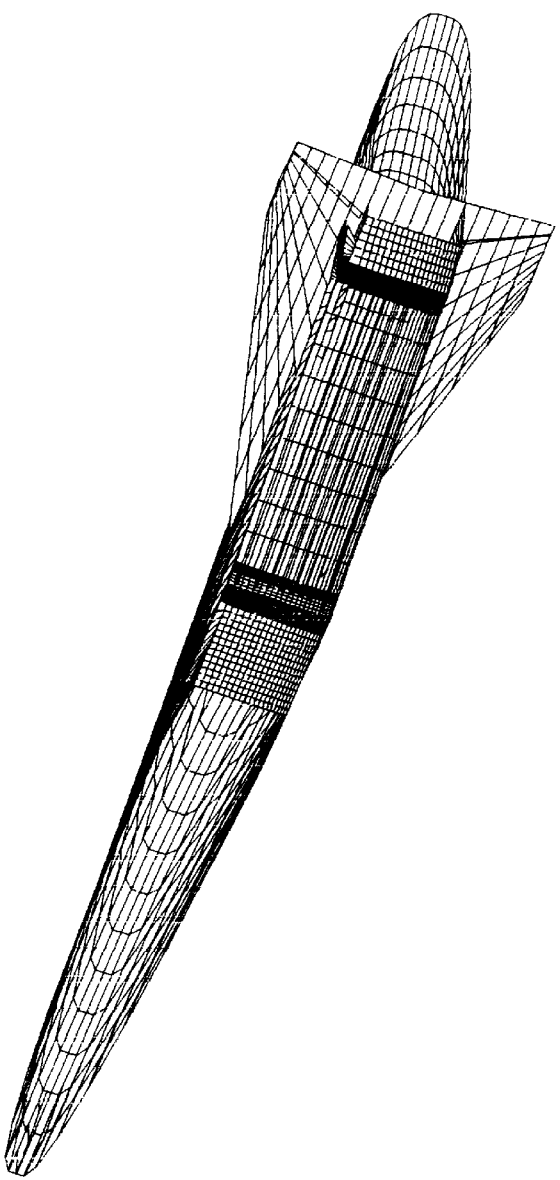
ASTROX HIGH-SPEED VEHICLE
Perspective View
Mesh Geometry
RDP = -0.33, Mach = 12.0
Rc/H = 0.99, W/H = 2.5
Fig. 31

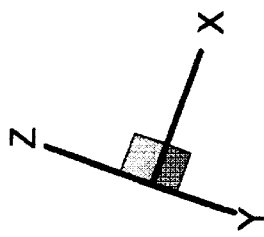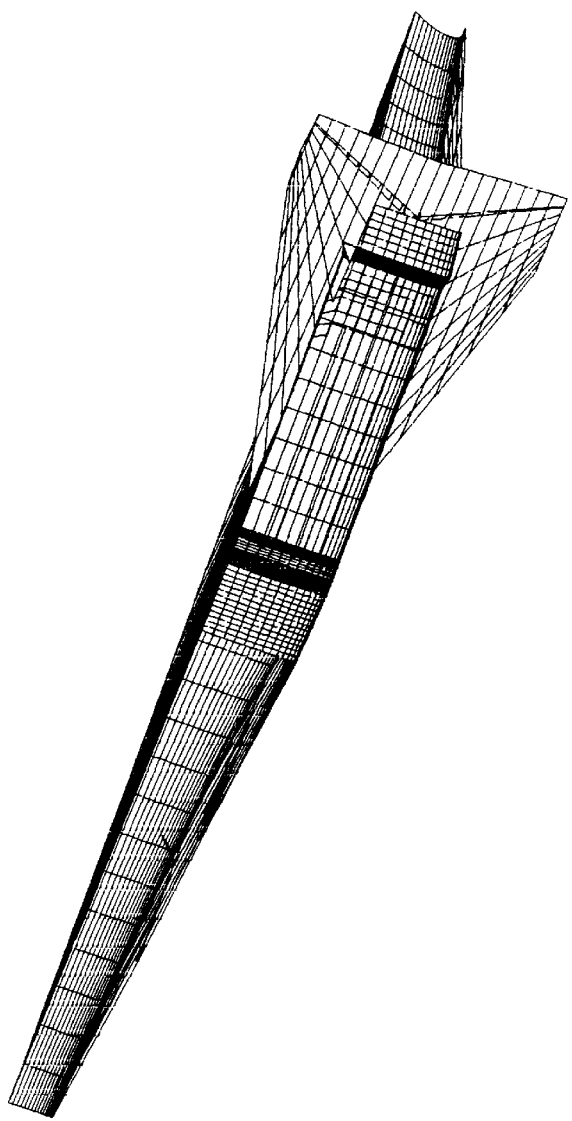
Fig. 34

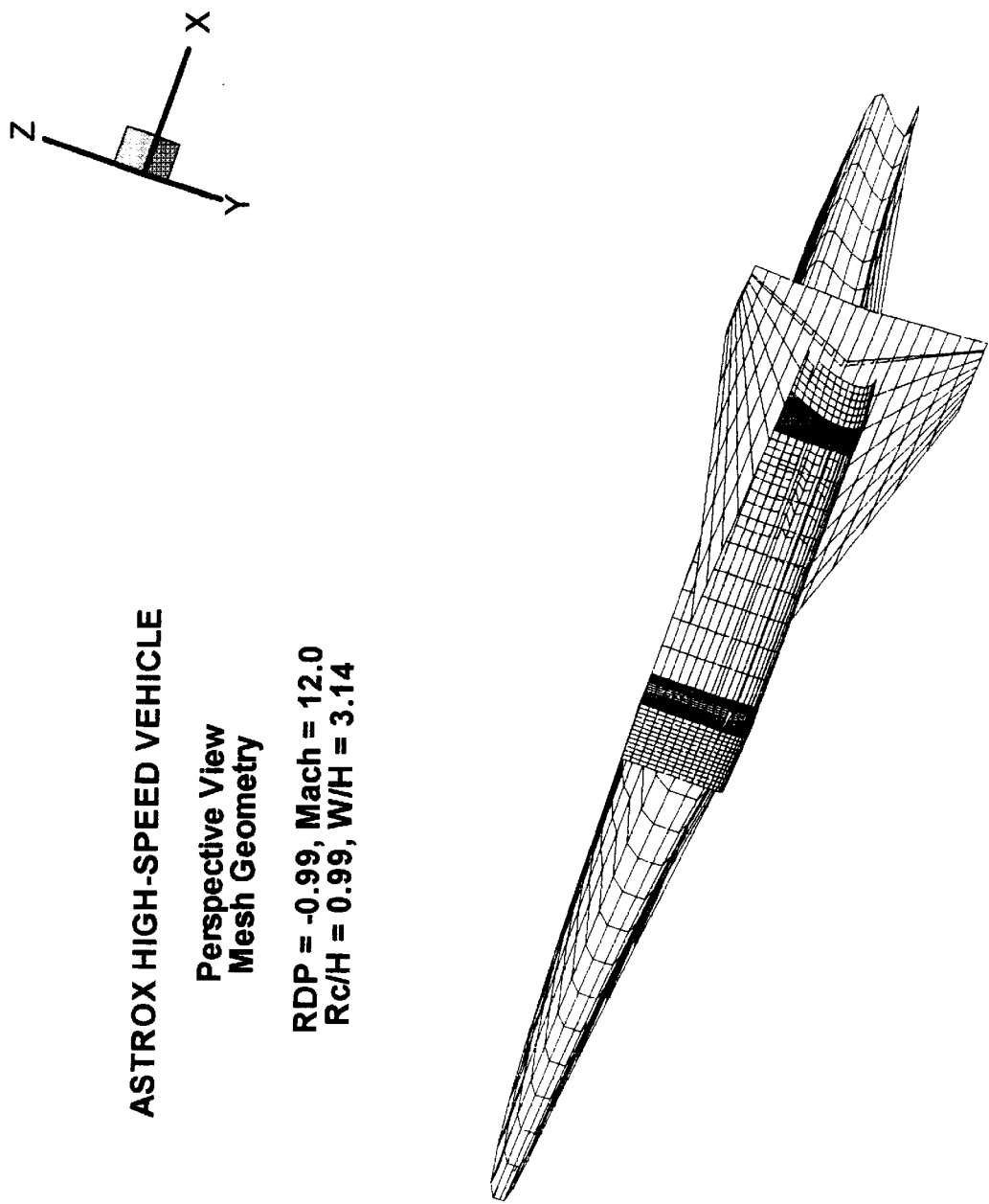

DESIGNS OF AND METHODOLOGY FOR INWARD OR OUTWARD, AND PARTIALLY INWARD OR OUTWARD TURNING FLOW HYPERSONIC AIR-BREATHING AND ROCKET-BASED-COMBINED-CYCLE VEHICLES

This appln claims benefit for Provisional No. 60/042,397 filed Mar. 25, 1997.

BACKGROUND OF THE INVENTION

The present invention is a method of designing a single inlet high-speed vehicle. More specifically, the present vehicle is designed based on a Radial Deviation Parameter (RDP).

Since the 1950's, there has been a great number of air-breathing hypersonic vehicle concepts proposed in the technical literature. Likewise, there have been a number of proposed missions for which air-breathing hypersonic flight is of potential benefit, such missions range from using single-stage-to-orbit (SSTO) to multi-stage-to-orbit (MSTO) flights. It is well known that the nature of such a high-speed flight within the Earth's atmosphere dictates many design concerns which must be addressed to create a vehicle that can accomplish the mission. Among other things, such vehicles must maintain a high capture area ratio, compress the captured stream tube to appropriate pre-combustion conditions, and integrate the airframe and propulsion systems. They must be able to handle the high heating loads with an effective thermal management system, and internally store the payload, structure, and fuel necessary to accomplish a given mission. The present designed configurations for hypersonic air-breathing vehicles satisfy many of the above-mentioned design concerns.

SUMMARY OF THE INVENTION

In general, the simplest designs and analysis methods are two-dimensional and axisymmetric outward turning in configuration, whereas the complex designs and analysis methods require complete three-dimensional designs. The present invention bridges the gap by producing simple designs that produce efficient, yet attractive designs of three-dimensional vehicles by using Radial Deviation Parameter (RDP).

The RDP is used to determine if a flow field is going radially inward or radially outward. For positive values of RDP, flows go inward toward the Axis of Revolution. For a zero value of the RDP, flows are two-dimensional. For negative values of RDP, flows go outward away from the Axis of Revolution. By prescribing the Leading Edge shape of the Inlet, the desired geometry can be carved out from axisymmetric calculations.

This method can be applied by using any numerical technique to solve the method of characteristics governing equations. It can also be applied with any programming languages such as FORTRAN, C, or PASCAL as done in the copyrighted HAVDAC code software of Astrox™ Corporation. A Pentium based computer would be sufficient to run the programs.

BRIEF DESCRIPTION OF THE DRAWING

FIG. 1 shows a graphical representation and a set of equations defining a Radial Deviation Parameter.

FIG. 2 shows a flow diagram of a design method using the Radial Deviation Parameter.

FIG. 2A shows a more detail flow diagram of the design method using the Radial Deviation Parameter.

FIGS. 2B–2D shows a blow up view of FIG. 2A.

FIG. 3 shows a variety of sample inlets created using a variety of values of the Radial Deviation Parameter.

FIG. 4 shows a number of vehicle designs using Radial Deviation Parameter

FIG. 12 shows a bottom mesh geometric view of an Astrox™ High-Speed Vehicle having a RDP value of 0.66 and a Rc/H value of 0.01.

FIG. 31 shows a perspective mesh geometric view of an Astrox™ High-Speed Vehicle having a RDP value of −0.33 and a Rc/H value of 0.99.

FIG. 34 shows a perspective mesh geometric view of an Astrox™ High-Speed Vehicle having a RDP value of −0.66 and a Rc/H value of 0.01.

FIG. 39 shows a perspective mesh geometric view of an Astrox™ High-Speed Vehicle having a RDP value of −0.99 and a Rc/H value of 0.99.

DETAIL DESCRIPTION

Figure 5:
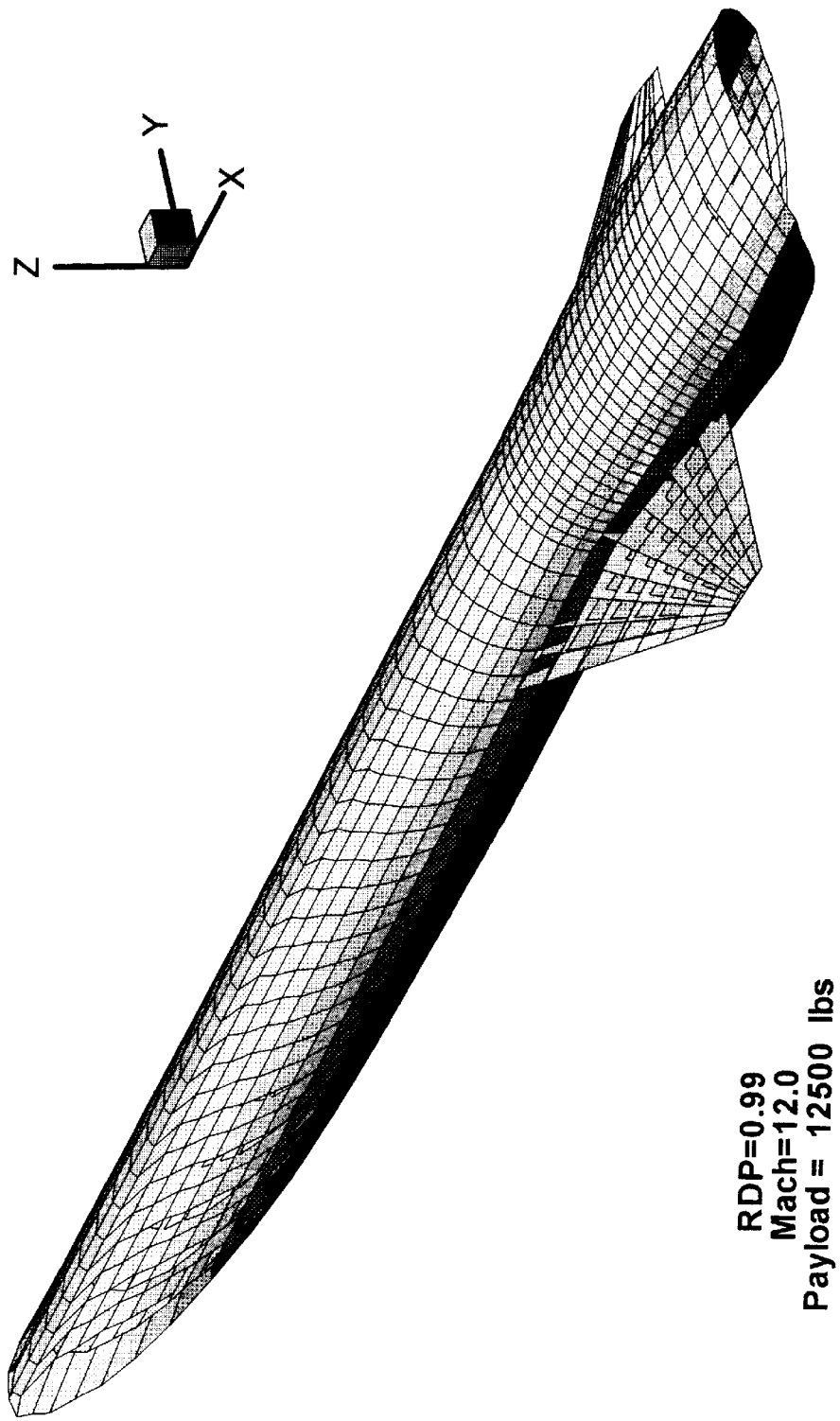
FIG. 5 shows a top view of a single inward turning Rocket Based Combined Cycle (RBBC) Single Stage To Orbit (SSTO) vehicle.

The subject of this patent application is a new method of designing high-speed vehicles and missiles. It uses a new concept called 'Use of Radial Deviation Parameter for Defining the Shape'. A detail theoretical foundation of this design titled "Hypersonic Vehicle Design Using Inward Turning Flowfields" was published in the 32nd AIAA/ASME/SAE/ASEE/ Joint Propulsion Conference held on Jul. 1–3, 1996 in Lake Buena Vista, Fla. This paper is incorporated herein by reference.

Commercialization of Space is now being heavily encouraged and even pushed by the Government. Companies are being encouraged to partially take over the function of putting payloads into space. To this end, a design that attains this goal cheaper is a better design allowing the designing company to have a more competitive edge in the commercial arena. The present invention provides such designs. The predominant problem of an air-breathing vehicle, which uses atmospheric Oxygen (unlike the rockets that carry $O_2$ and $H_2$), is the trouble related to closing the inlet, especially of a high weight and a high volume vehicle. The heating problem is prohibitive at high Mach numbers for air-breathing vehicles and thus requiring substantial active cooling treatment. The present invention provides many designs that can overcome these problems at an affordable cost. These designs have been developed by the Applicant. The present invention is able to put payloads as well as passengers to space at hypersonic speeds with an affordable cost.

Inward and Outward Turning Flowfield with RDP (Radial Deviation Parameter variation: Designs that utilize this type of flowfield effect have never been studied before. Therefore, there have not been any vehicle designs utilizing RDP variations. They are designed for the very first time by the Applicant. Effects of this variation on vehicle performance is substantial and beneficial. This may make the difference in being able to go to space (access-to-space) using substantial or major air-breathing propulsive mechanisms in addition to other mechanisms. These designs provide vehicles utilizing less fuel reach the same Mach number.

Further, within any of these RDP flowfields, the shape of the leading edge front view is defined and carved out in any shapes desired. This gives one the freedom to design combustor/isolator shape in any desired configuration. The present invention provides a whole new design space to space vehicle designers. A proper shaping of these parameters allows one to fit various designed modules together. The present invention can be practiced with more than one modules, e.g. two, three, four or more.

Properly shaped spikes will be placed within the combustor/isolator areas and axially translated within a varying area combustor/isolator to properly compress the flow further at higher freestream Mach numbers.

A cowl designed will also be translated axially or moved vertically to allow for engine startup at supersonic Mach numbers.

The Radial Deviation Parameter (RDP) is described in FIG. 1. This parameter is used to describe the degree to which a generating method of characteristic flow field is deviating from a two-dimensional flow. The inward RDP, Outward RDP and two dimensional RDP are defined as shown in FIG. 1. An axisymmetric calculation is made and by using the RDP, more complex geometric configurations are created. For positive values of RDP, flows go inward toward the Axis of revolution. For a zero value of RDP, flows are two-dimensional. For negative values of RDP, flows go outward away from the Axis of Revolution.

The present invention consists of the following seven parts, namely, an Inlet 3, an Isolator/combustor 5, a Nozzle 7, and an External surface 11, a Lower wing and an Upper Wing 9, as shown in FIG. 2. In the first step of the design method, freestream properties are selected along with the value of RDP parameter. The method of characteristics is used to determine the shape of the Inlet and the exit properties of the Inlet. Treating the exit properties of the Inlet as the input properties, the next module, Isolator, is created. From the exit properties of this module, the next module, Combustor, is created. Using the Combustor exit properties, the Nozzle is created. The to external Surface module is created to blend in with the flow. The Lower and Upper Wing modules are created to match the Lift created to the Weight of the vehicle. By prescribing the Leading Edge shape of the Inlet, the desired geometry can be carved out from the axisymmetric calculations. Once a value of RDP is selected and the overall compression field is thus chosen any shape for the leading edge can be given. This carves out the appropriate vehicle.

More specific discussions of each of the identified elements in the flow diagram is provided hereinbelow.

Regarding inlet 3, a typical set of input parameters, such as a Mach number, altitude, Inlet capture area and static pressure at the combustor (throat pressure) are specified. A method of characteristics is used to create the streamlines that pass through the capture area. These streamlines are converted into hoops and stringer forming the vehicle's geometry. Viscous analysis is performed on this geometry and the viscous geometry is carved out. The radial deviation parameter is used to apply the three-dimensional effects.

Regarding the isolator/combustor 5, the flow in the combustor is assumed to be quasi-one-dimensional. Hydrogen fuel is accelerated to the combustor static pressure and injected into the combustor. This results in an increased area at the combustor inlet. Complete mixing and burning is assumed. The burning takes place in incremental steps. In this way the flow properties along the combustor can be determined.

Regarding Nozzle 7, the nozzle design is started by matching the properties at the combustor exit and the nozzle inlet. The area at the nozzle exit is given as the input. A method of characteristics is used to locate the streamlines until this area is reached. Similar to the inlet design, a viscous carving is performed.

Regarding the External Surface 11, once the engine flow path is computed, control hoops are selected based on the inlet and exit configurations. These are connected to form a smooth surface. The shock expansion method is used to calculate the flow properties on this surface.

Regarding Wing 9, wings are assumed to be having a delta wing planform and a half-diamond cross-section. They are placed such that the wind aerodynamic center coincides with the center of gravity.

Regarding optimization of the output geometry 13, once the design is completed, it can be optimized for certain design parameters, such as gross weight.

FIG. 3 shows graphical representations of a flow field from different perspectives with a variety of RDP numbers. The graphical representations on the left-most column show an inlet head-on view of the flow field. The second column shows various RDP numbers. The third column shows three dimensional views of the flow field. The information on each row correspond with each other. For instance, the inlet head-on view of the flow field 15 and the three-dimensional view of flow field 21 are graphical depictions having a RDP value of 0.99. One should note that end 19 represents the inlet and end 17 represents the outlet (exit of the inlet). End 17 is much narrower than end 19, depicting that the outlet flow field has been compressed as compared to the inlet flow field. The other rows are organized in the same manner.

It is apparent from observing the three dimensional views that the type of outlet compression where RDP=0.99 is more inward turning than the outlet compression where RDP= 0.33. For a negative RDP value, the outlet flow field is more outwardly compressed than the positive RDP flows.

FIG. 4 shows various designs based on various RDP values. The top design depicts an inward turning vehicle where RDP is positive. The middle design shows a two dimensional vehicle where RDP is zero. The third design shows an outward turning vehicle where RDP is negative.

FIG. 5 shows a top view of a single inward turning Rocket Based Combined Cycle (RBBC) Single Stage To Orbit (SSTO) vehicle. This is a single inlet/module design for RDP=0.99, designed for a Mach number of 12. The flow is from left-to-right. The nozzle is seen on the rear of the vehicle.

Figure 6:
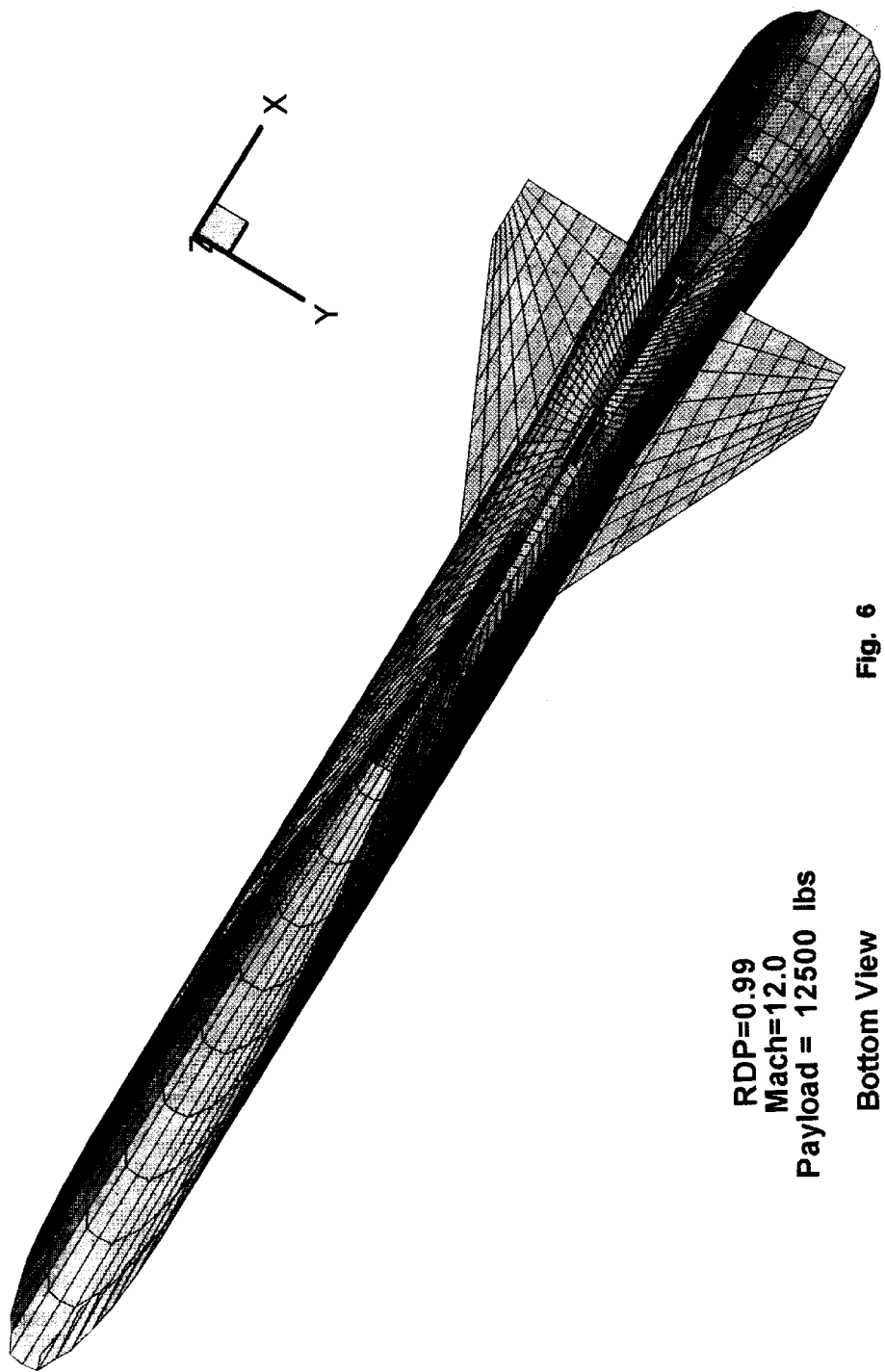
FIG. 6 shows a bottom view of a single inward turning Rocket Based Combined Cycle (RBBC) Single Stage To Orbit (SSTO) vehicle.

FIG. 6 shows a bottom view of a single inward turning Rocket Based Combined Cycle (RBBC) Single Stage To Orbit (SSTO) vehicle. In this bottom view picture, the cowl, isolator, combustor can be seen also. These vehicles are designed to carry 12,500 lbs. of payload into the Low Earth Orbit (LEO).

Figure 7:
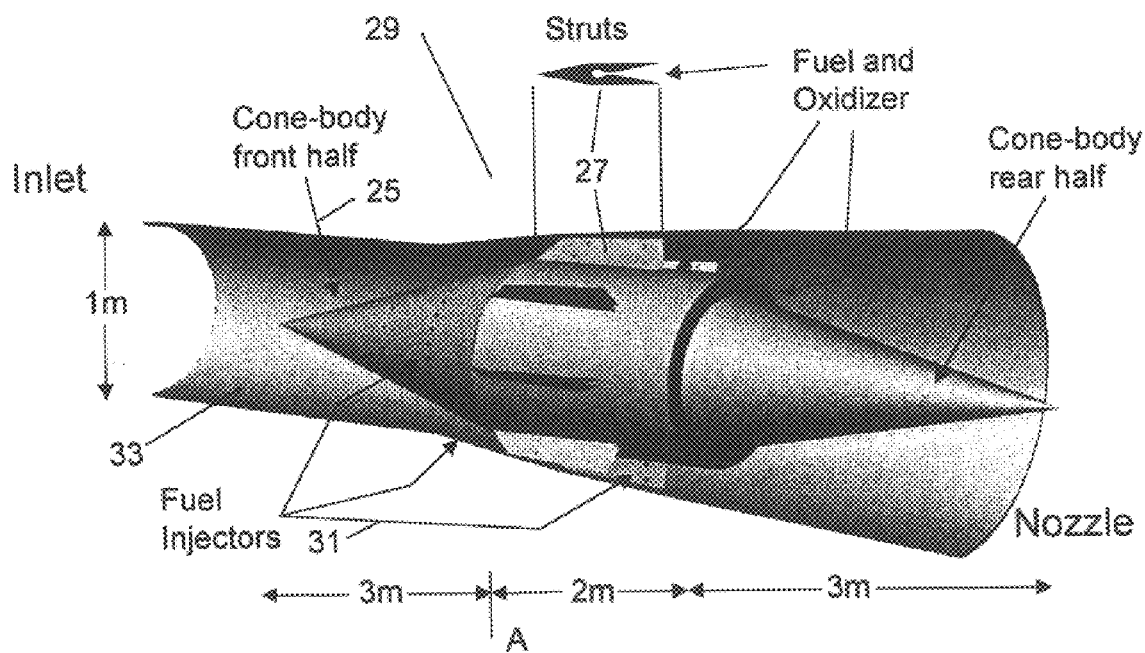
FIG. 7 shows a plane view of a mid-section of a single Rocket Based Combined Cycle (RBBC) engine.

FIG. 7 shows a combustor with a cone-body single inlet Based Combined Cycle (RBBC) engine 29, having a conical forebody 25, a plurality of struts 27, a plurality of fuel injectors 31 and engine housing 33. At the inlet end, a flow field comprising of various gases (ambient air) is introduced into the engine 29. The cross-sectional area decreases as the flow moves further downstream into the engine, thus compressing the air. The flow field is compressed to the maximum extent when it reaches reference mark A. The inside of each strut is shaped like a rocket nozzle.

For take-off, the fuel and the oxidizer mix is ejected from the plurality of the strut nozzles to create the requisite thrust to propel the vehicle forward. The air enters through the inlet and partially burns in this ejector-ramjet mode. This continues until the vehicle reaches an approximate Mach number between 2.2 and 2.6. At about Mach 2.5, the RAMJET mode is started and fuel is introduced into the flow downstream of the strut exits through the plurality of injectors, at which point the oxidizer in the plurality of struts is also turned off progressively. As Mach number increases, the fuel is injected more and more upstream from the plurality of injectors. At about Mach 6 to 6.5, SCRAMjet (Supersonic Combustion RAMjet) mode predominates. Throughout this progression, the front half of the cone-body is translated forward by known means (e.g. hydraulic) so as to produce smaller available cross-sectional areas between the conical body 25 and engine housing 33, to further compress the flow internally as the vehicle has climbed now to higher and higher altitude and hence lower ambient pressures. This exercise is continued as the speed and the Mach number increase through the hypersonic regime to Mach 14–16. At this point, the air is too thin and is unable to create enough thrust minus drag (T–D) and the effective specific impulse falls below that of a pure rocket. At this point the cone-body is moved forward enough to block the inlet exit, the plurality of struts are again turned on to eject the fuel and the oxidizer, the vehicle becomes a rocket and perform the pull-up maneuver to exit the earth's atmosphere traveling toward space.

Figure 8:
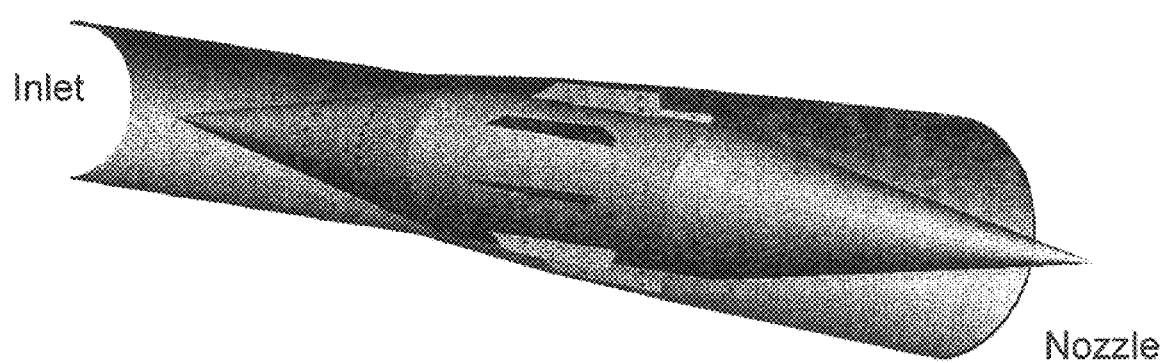
FIG. 8 shows an exploded view of a combustor with a traversing cone.

FIG. 8 shows an exploded view of a combustor with a traversing cone.

FIGS. 9 through 39 show various views of designs for RDP values of 0.99, 0.66, 0.33, 0.01, –0.33, –0.66, and –0.99. Also designs with different sweep in the leading edge (Rc/H) and different Width-to-Height (W/H) ratios are included for the sake of completeness.

Figure 9:
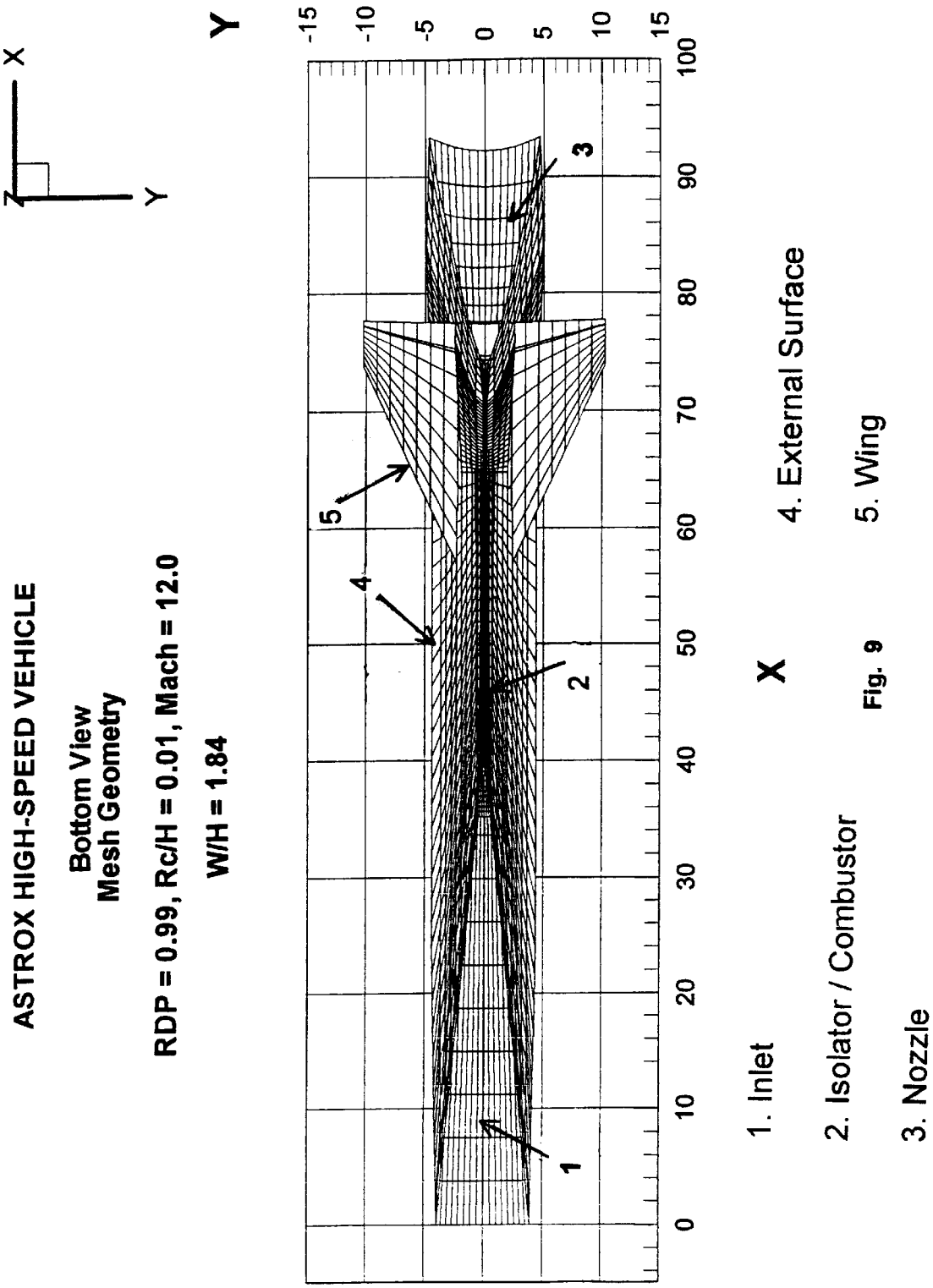
FIG. 9 shows a bottom mesh geometric view of an Astrox™ High-Speed Vehicle having a RDP value of 0.99 and a Rc/H value of 0.01.
Figure 10:
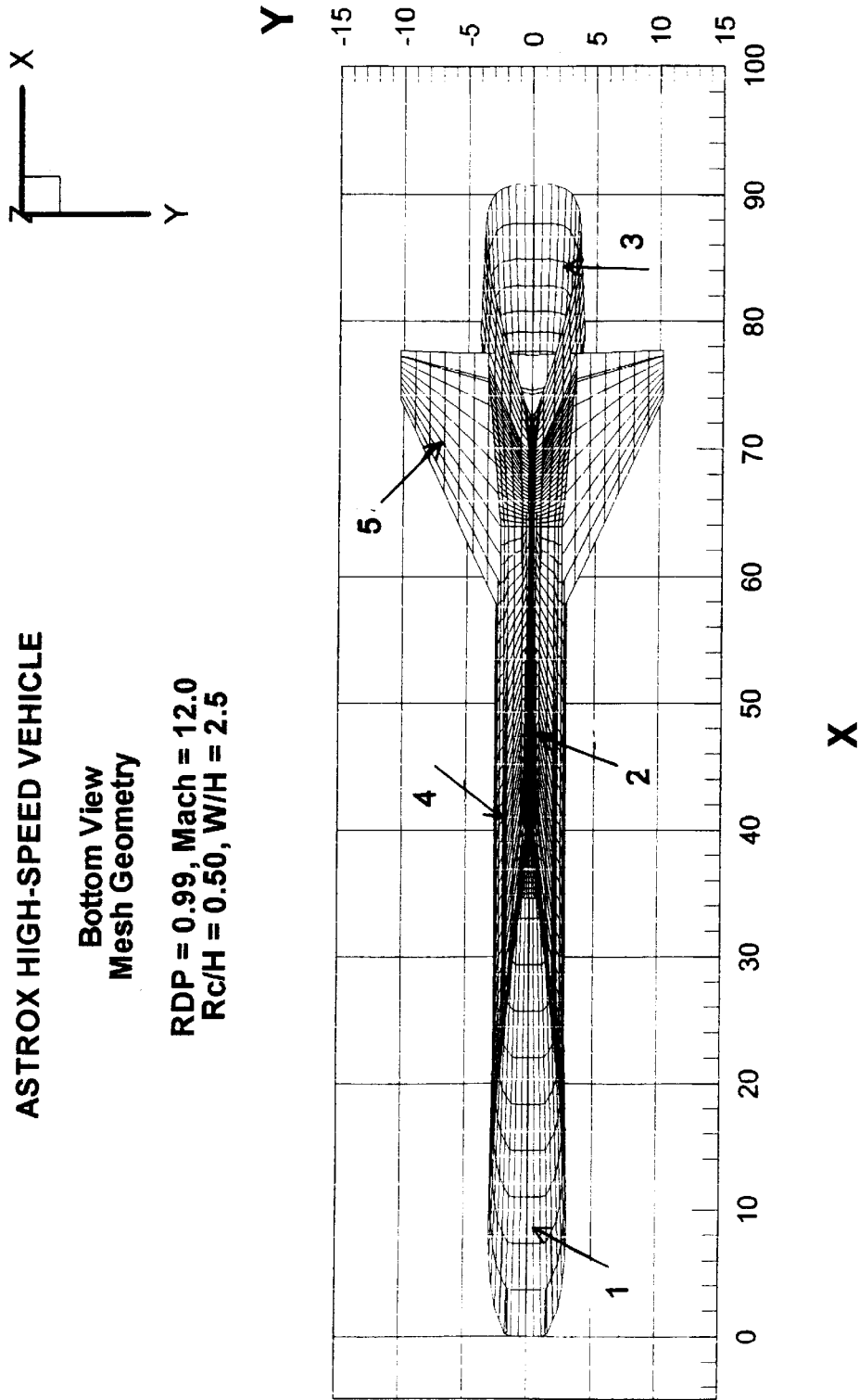
FIG. 10 shows a bottom mesh geometric view of an Astrox™ High-Speed Vehicle having a RDP value of 0.99, a Rc/H value of 0.50, and a W/H value of 2.5.
Figure 11:
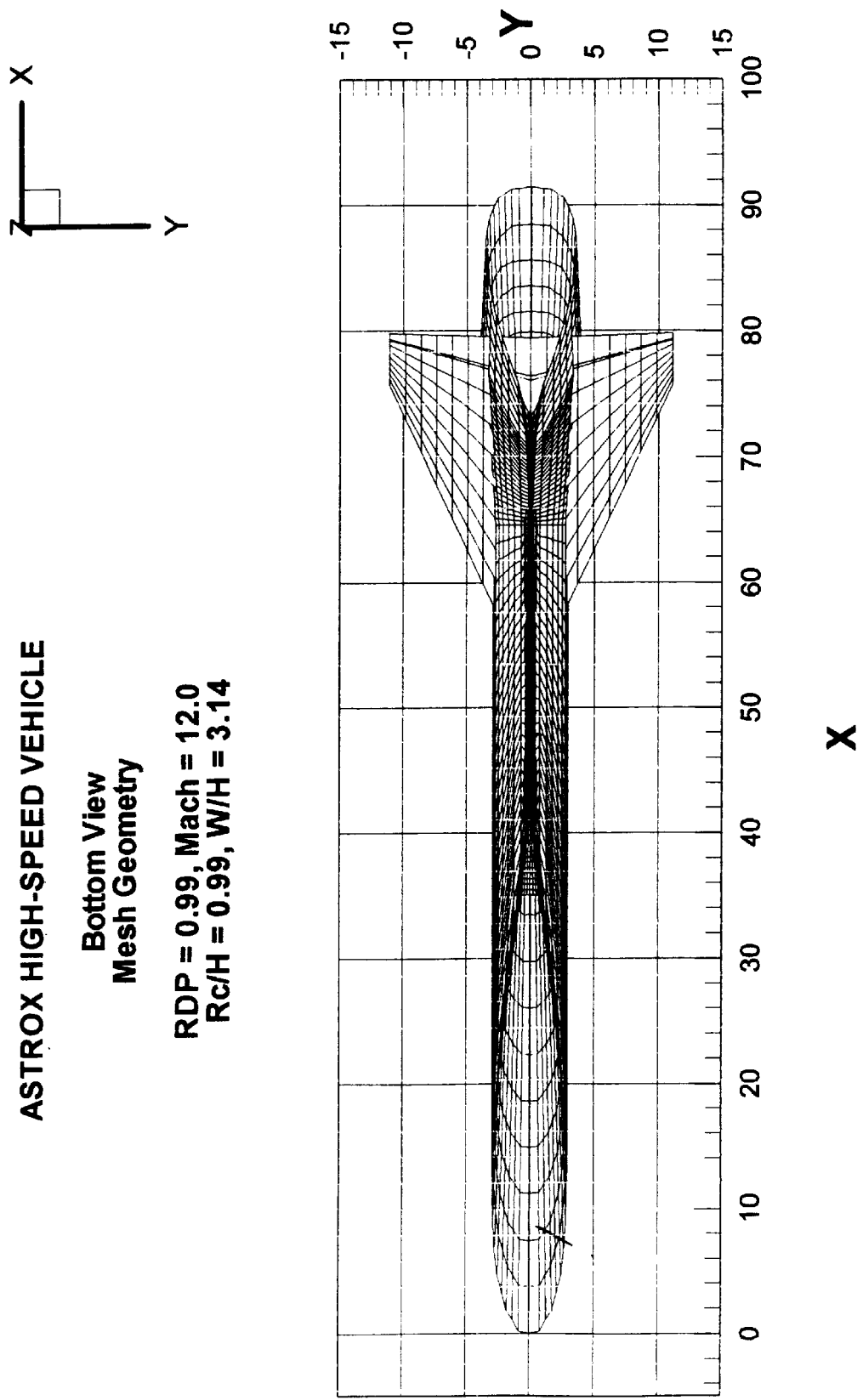
FIG. 11 shows a bottom mesh geometric view of an Astrox™ High-Speed Vehicle having a RDP value of 0.99, a Rc/H value of 0.99, and a W/H value of 3.14.
Figure 13:
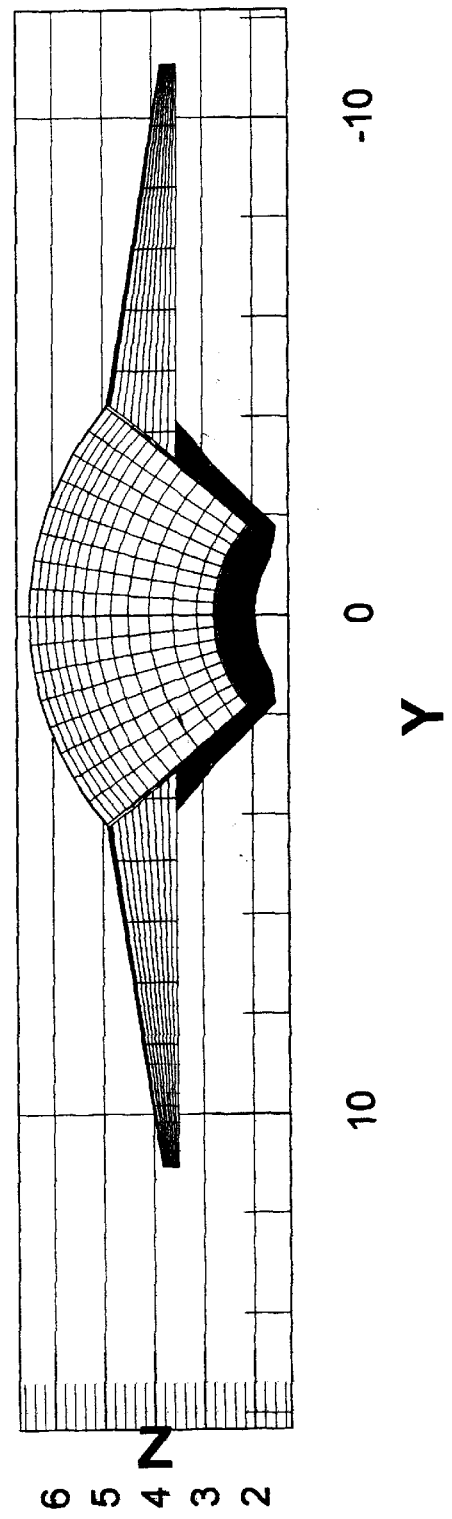
FIG. 13 shows a front mesh geometric view of an Astrox™ High-Speed Vehicle having a RDP value of 0.66 and a Rc/H value of 0.01.
Figure 14:
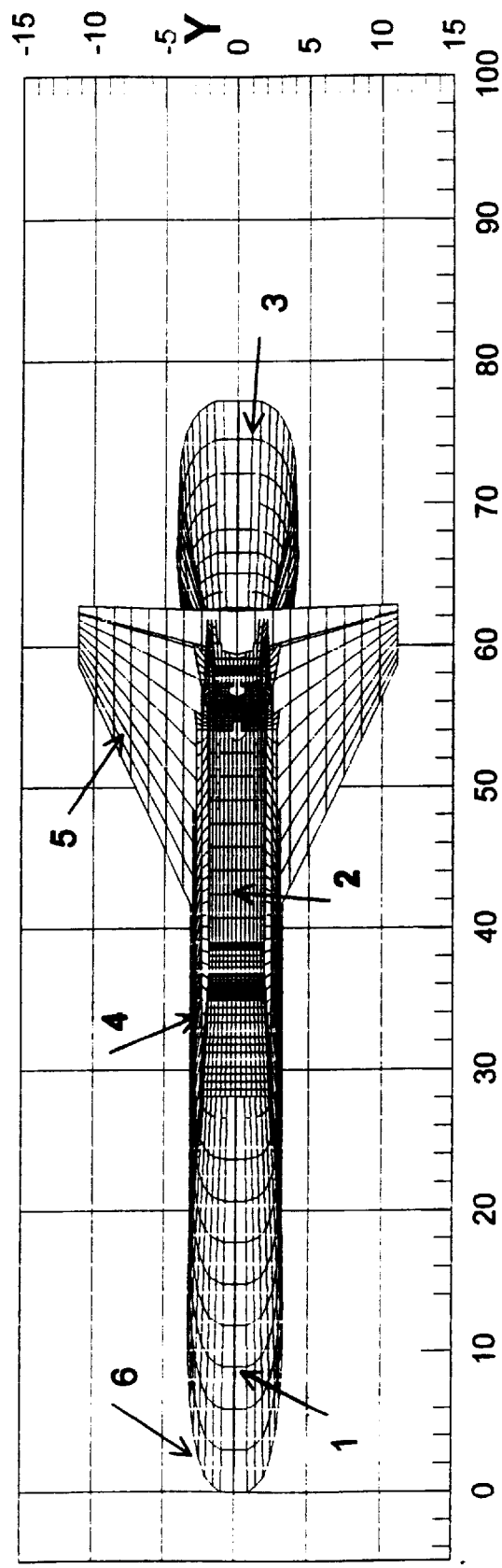
FIG. 14 shows a bottom mesh geometric view of an Astrox™ High-Speed Vehicle having a RDP value of 0.66, a Rc/H value of 0.99 and a W/H value of 3.14.
Figure 15:
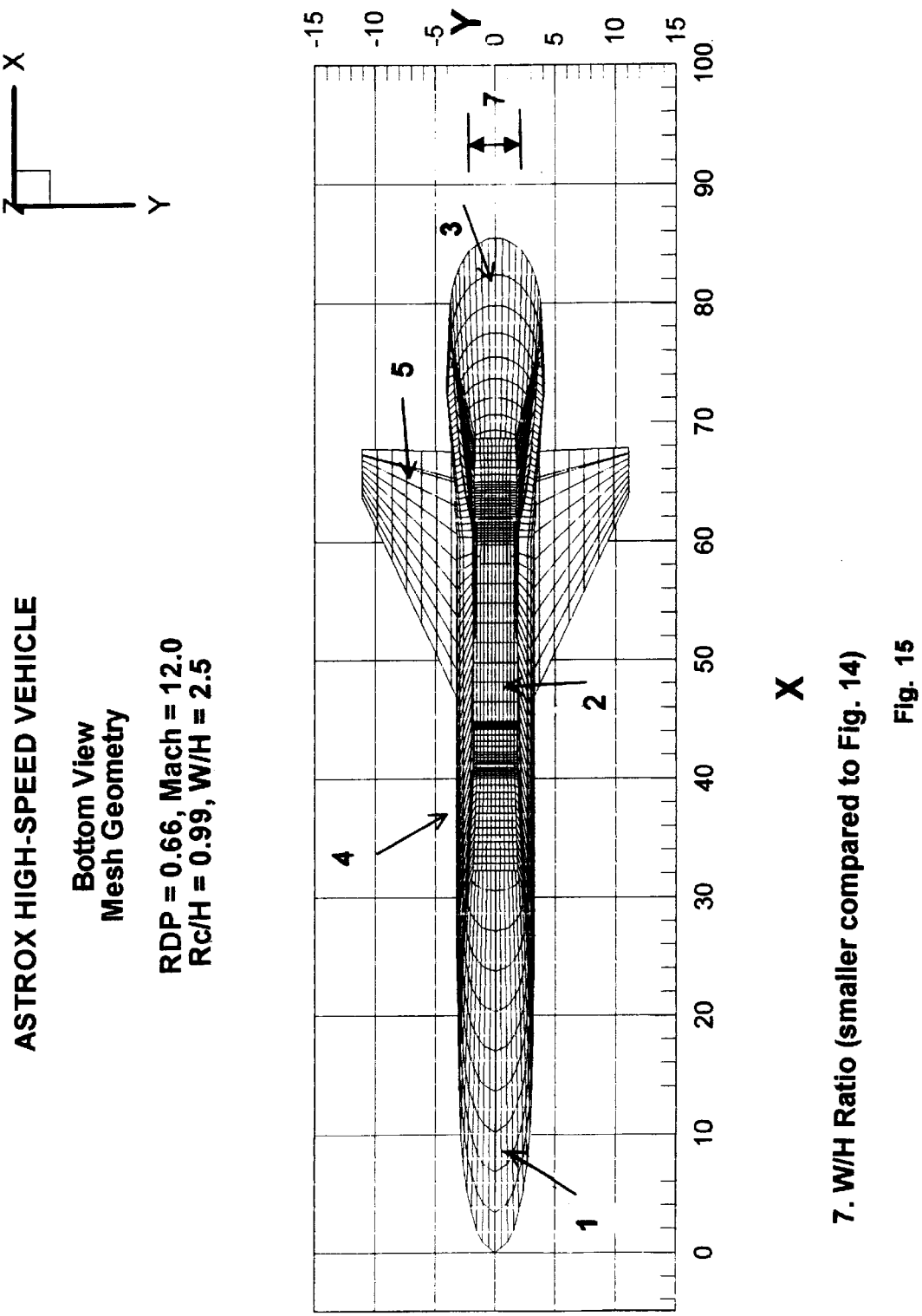
FIG. 15 shows a bottom mesh geometric view of an Astrox™ High-Speed Vehicle having a RDP value of 0.66, a Rc/H value of 0.99 and a W/H value of 2.5.
Figure 16:
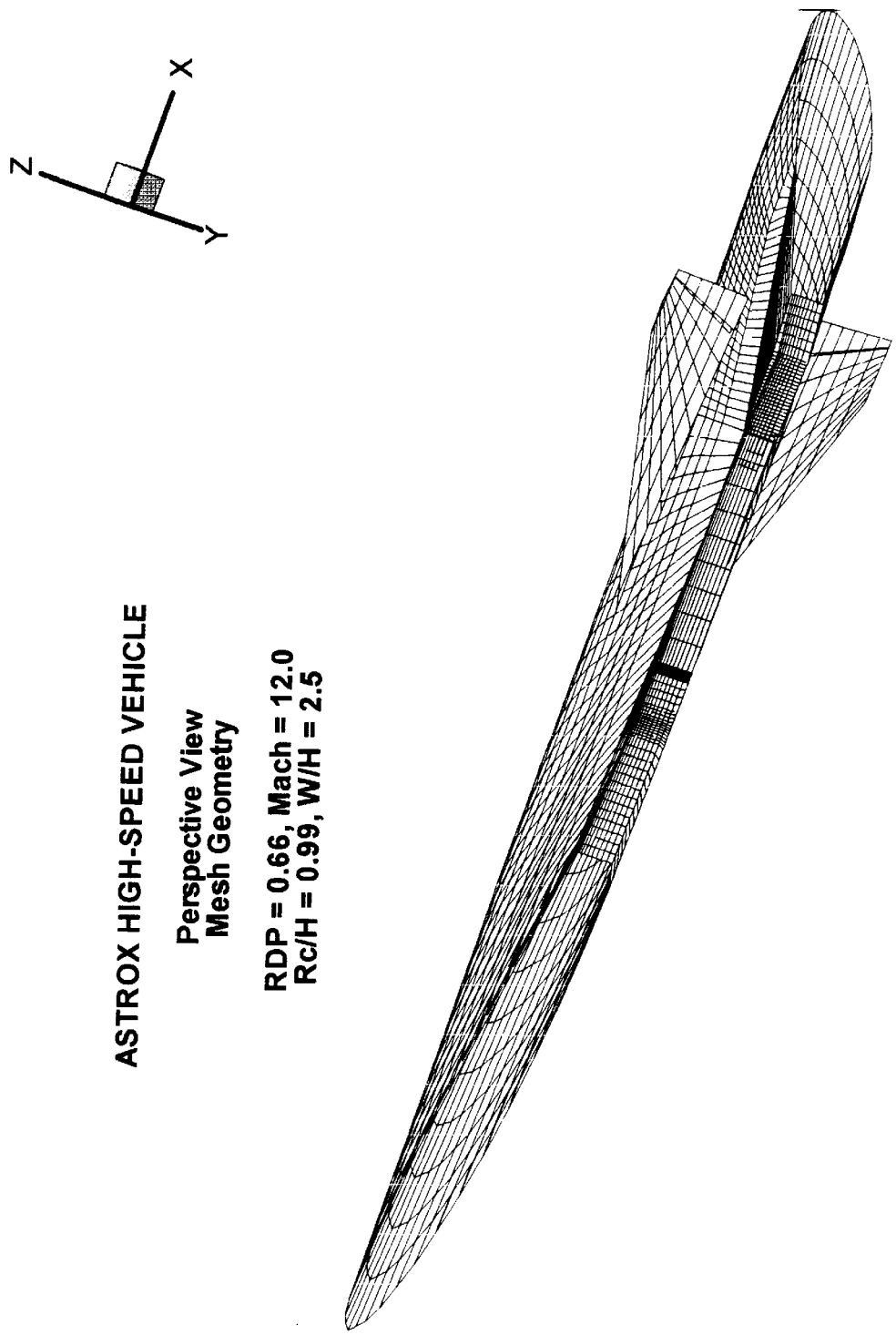
FIG. 16 shows a perspective mesh geometric view of an Astrox™ High-Speed Vehicle having a RDP value of 0.66 and a Rc/H value of 0.99.
Figure 17:
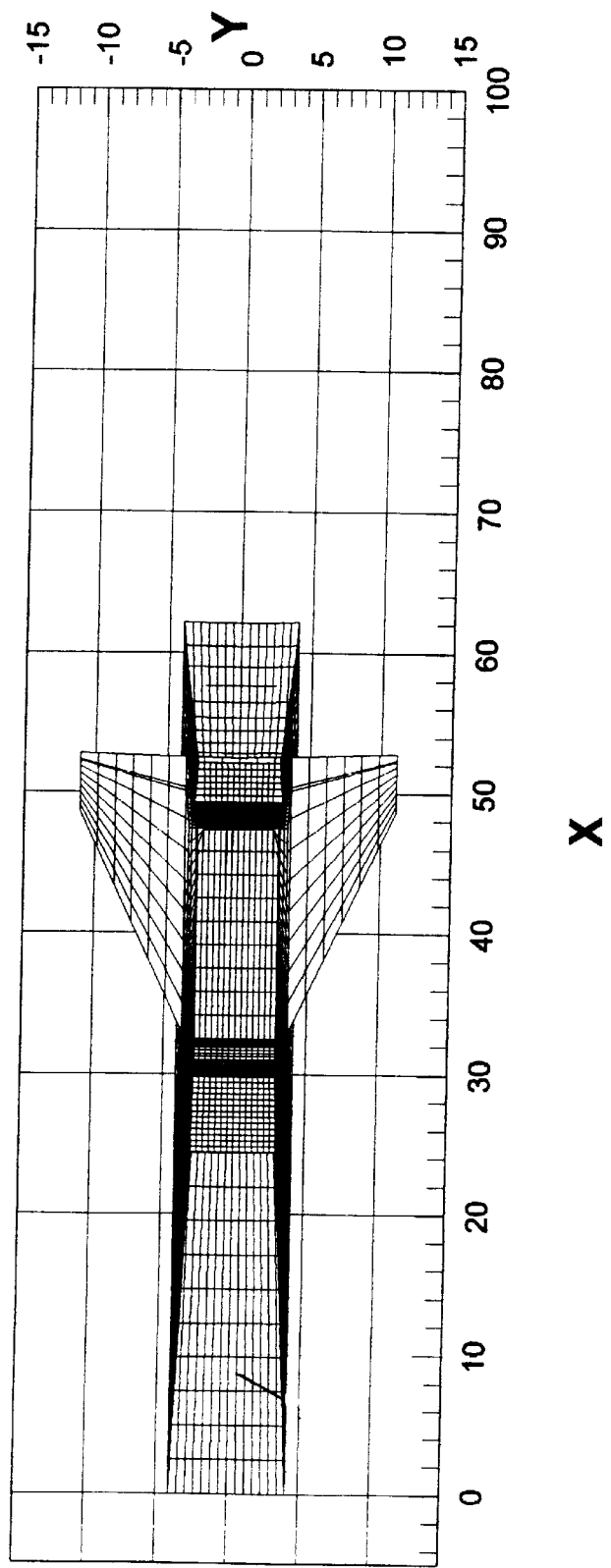
FIG. 17 shows a bottom mesh geometric view of an Astrox™ High-Speed Vehicle having a RDP value of 0.33 and a Rc/H value of 0.01.
Figure 18:
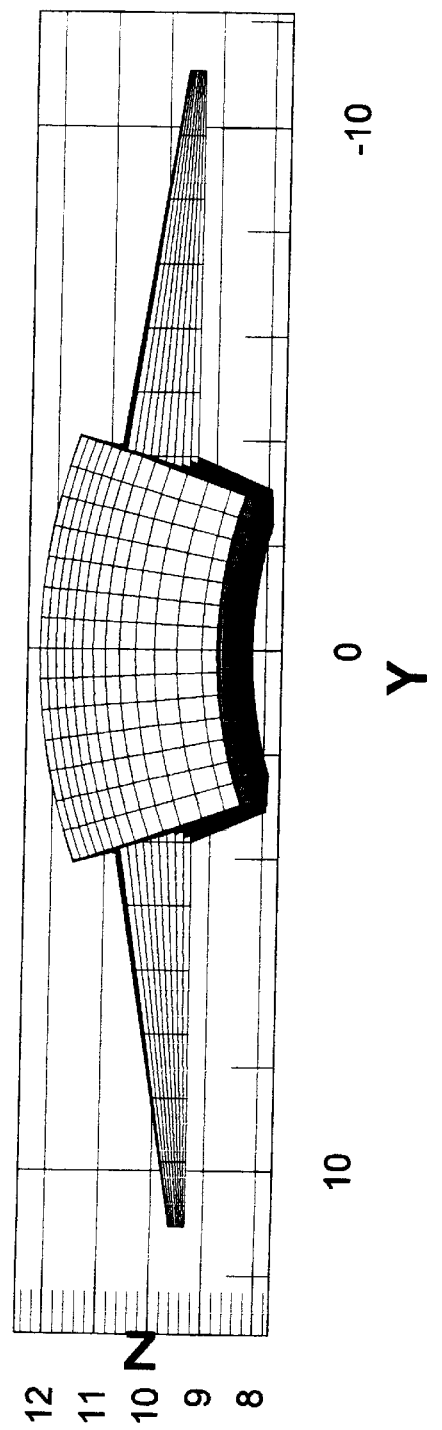
FIG. 18 shows a front mesh geometric view of an Astrox™ High-Speed Vehicle having a RDP value of 0.33 and a Rc/H value of 0.01.
Figure 19:
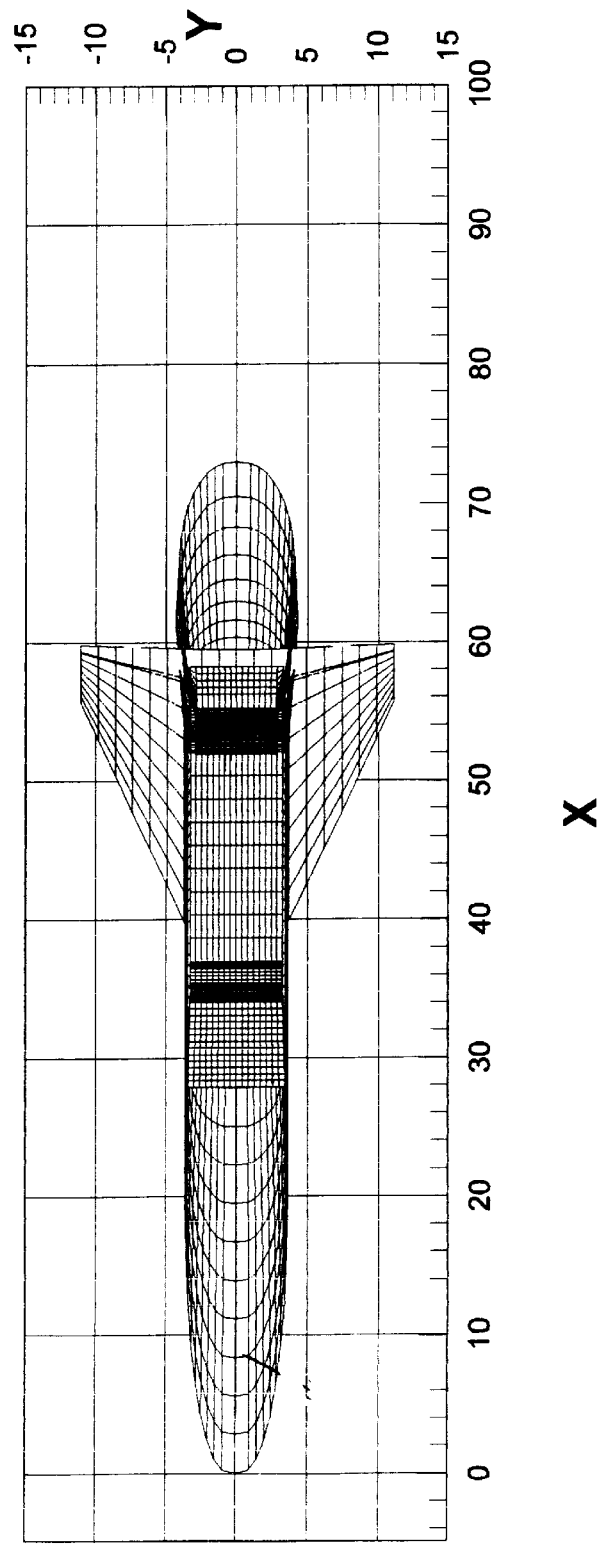
FIG. 19 shows a bottom mesh geometric view of an Astrox™ High-Speed Vehicle having a RDP value of 0.33 and a Rc/H value of 0.99.
Figure 20:
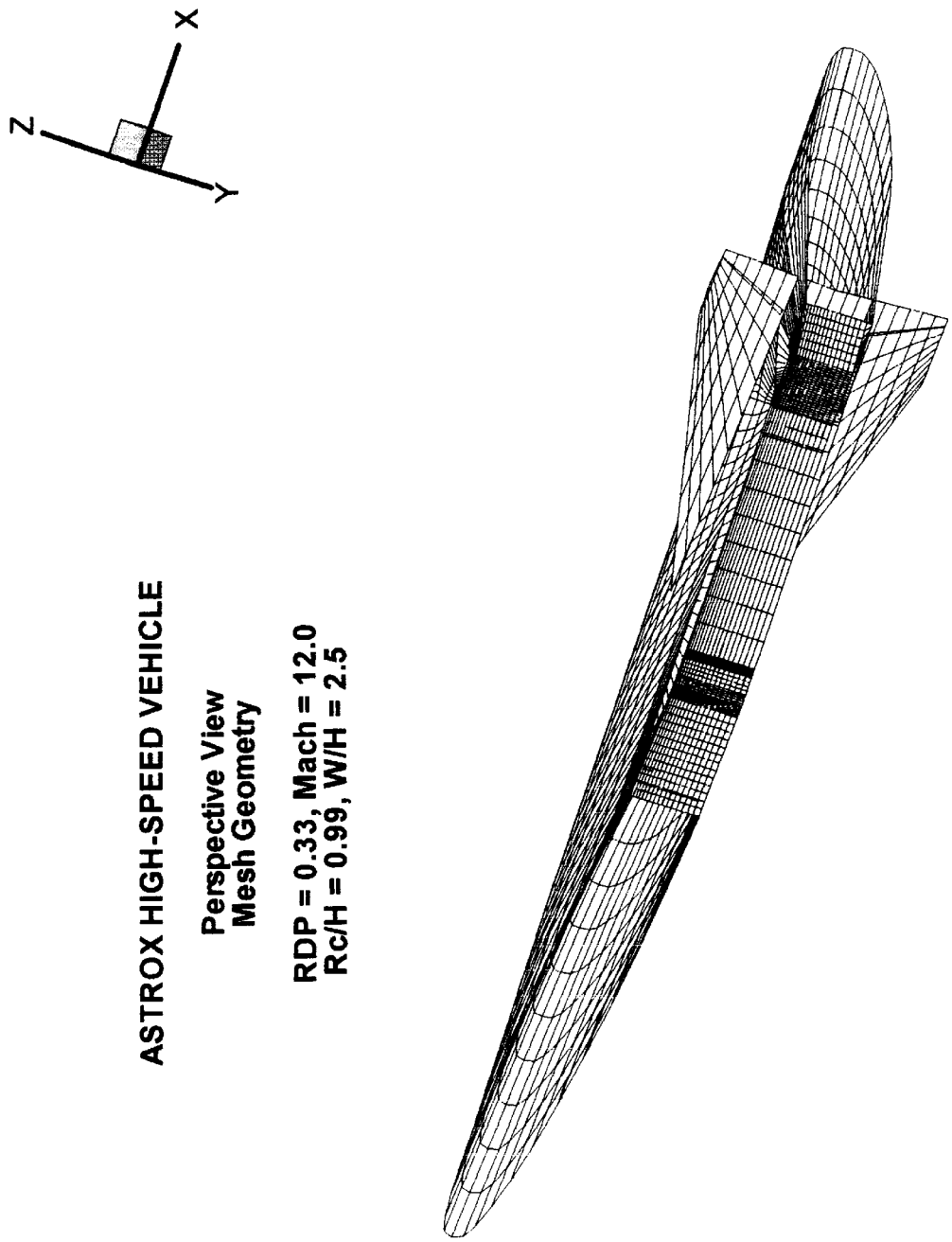
FIG. 20 shows a perspective mesh geometric view of an Astrox™ High-Speed Vehicle having a RDP value of 0.33 and a Rc/H value of 0.99.
Figure 21:
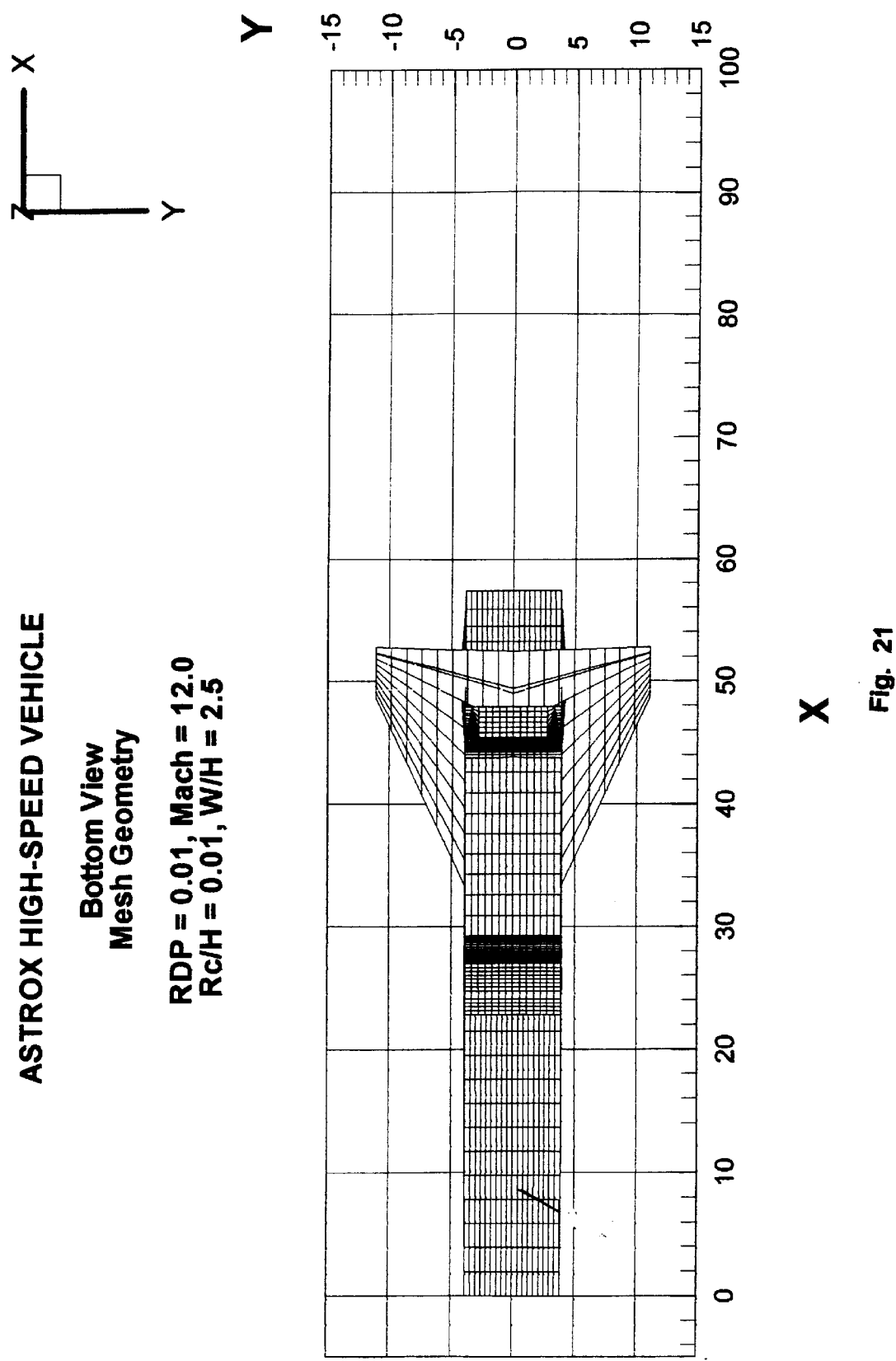
FIG. 21 shows a bottom mesh geometric view of an Astrox™ High-Speed Vehicle having a RDP value of 0.01 and a Rc/H value of 0.01.
Figure 22:
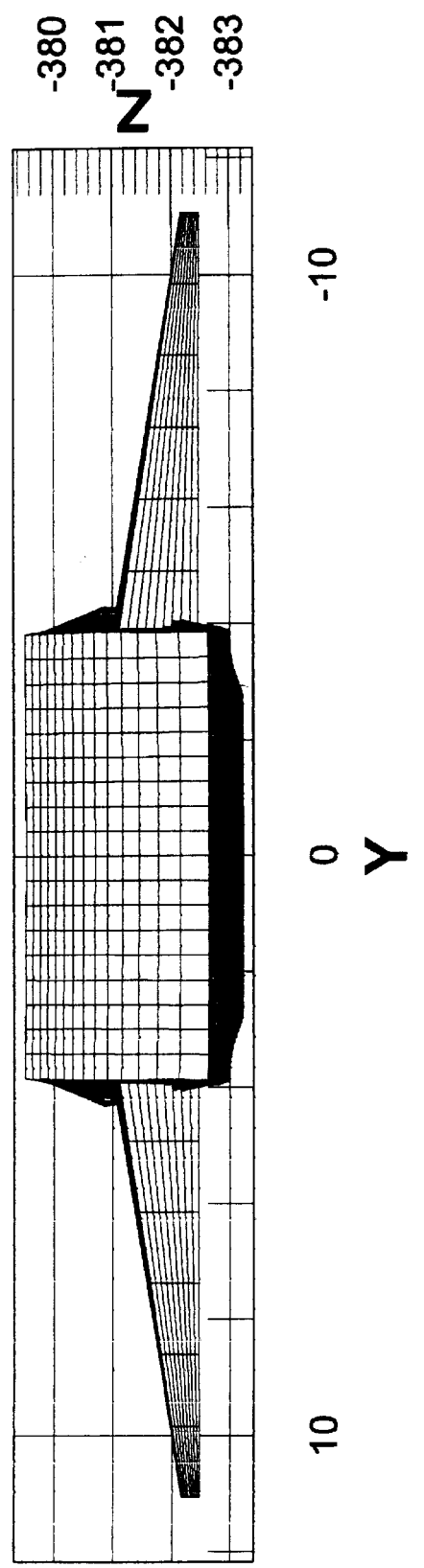
FIG. 22 shows a front mesh geometric view of an Astrox™ High-Speed Vehicle having a RDP value of 0.01 and a Rc/H value of 0.01.
Figure 23:
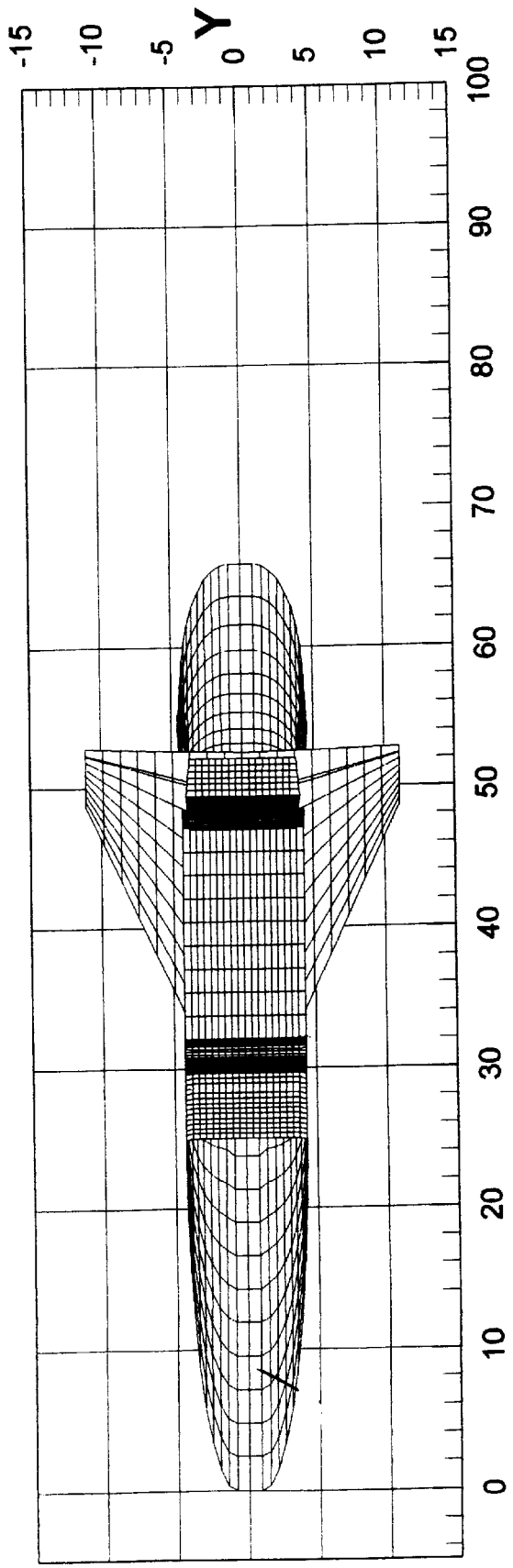
FIG. 23 shows a bottom mesh geometric view of an Astrox™ High-Speed Vehicle having a RDP value of 0.01 and a Rc/H value of 0.99.
Figure 24:
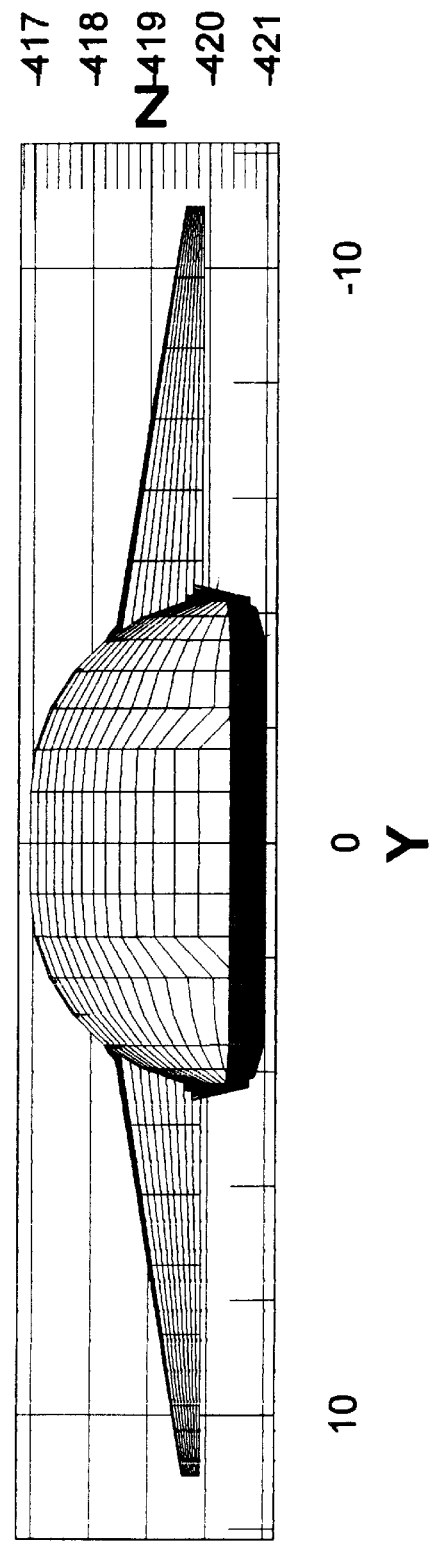
FIG. 24 shows a front mesh geometric view of an Astrox™ High-Speed Vehicle having a RDP value of –0.01 and a Rc/H value of 0.99.
Figure 25:
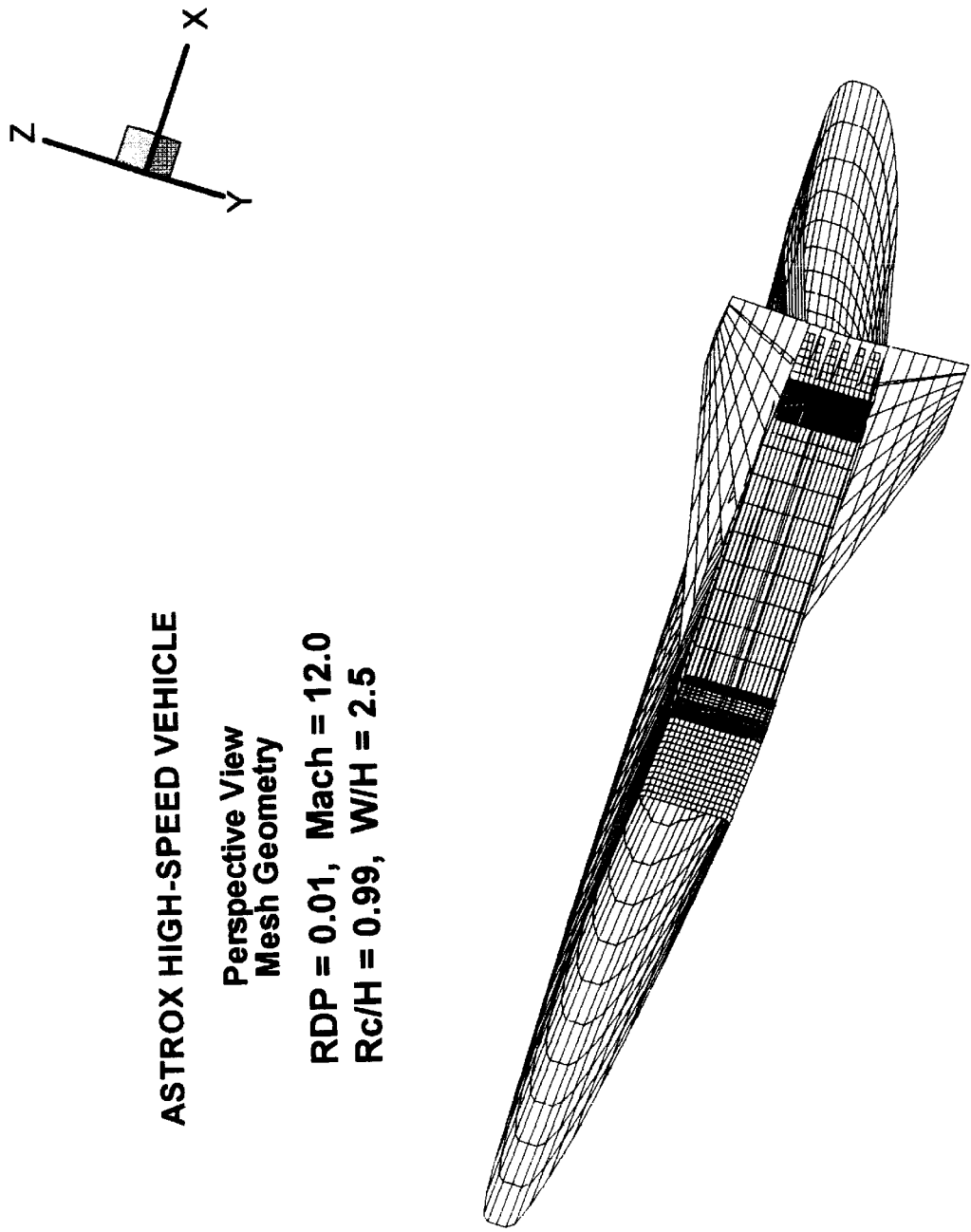
FIG. 25 shows a perspective mesh geometric view of an Astrox™ High-Speed Vehicle having a RDP value of 0.01 and a Rc/H value of 0.99.
Figure 26:
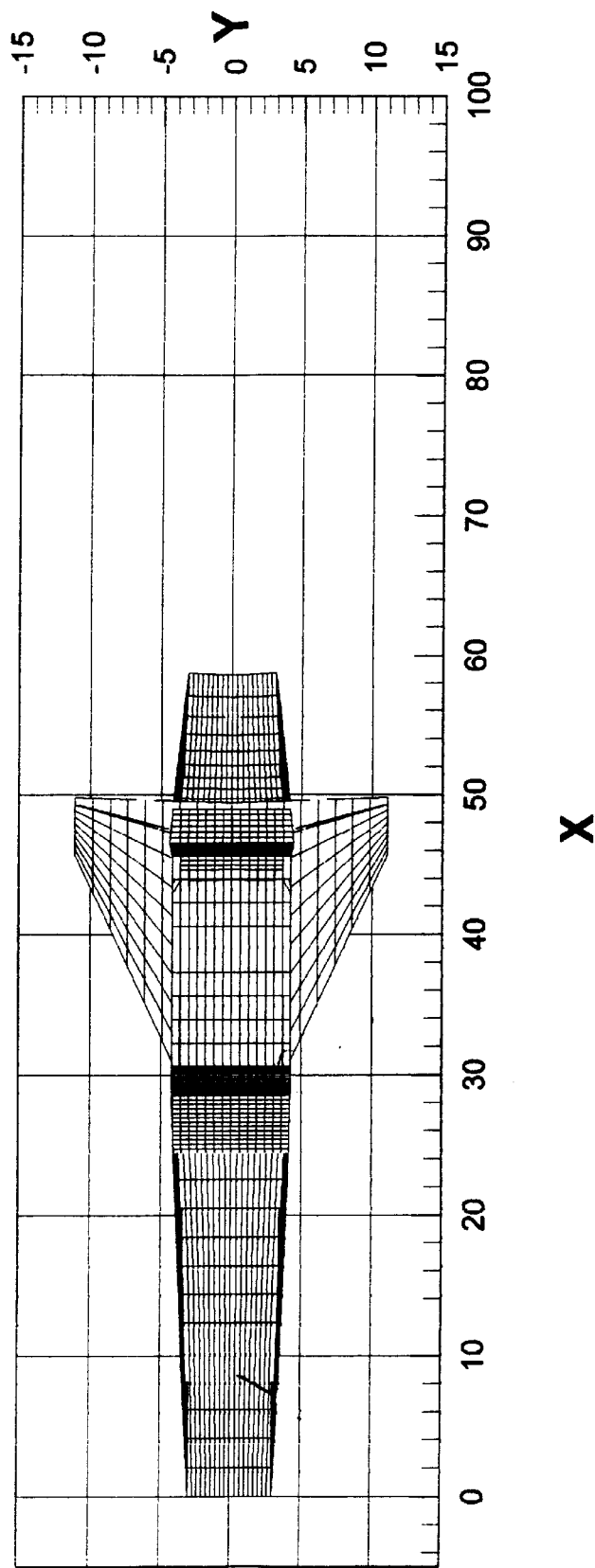
FIG. 26 shows a bottom mesh geometric view of an Astrox™ High-Speed Vehicle having a RDP value of −0.33 and a Rc/H value of 0.01.
Figure 27:
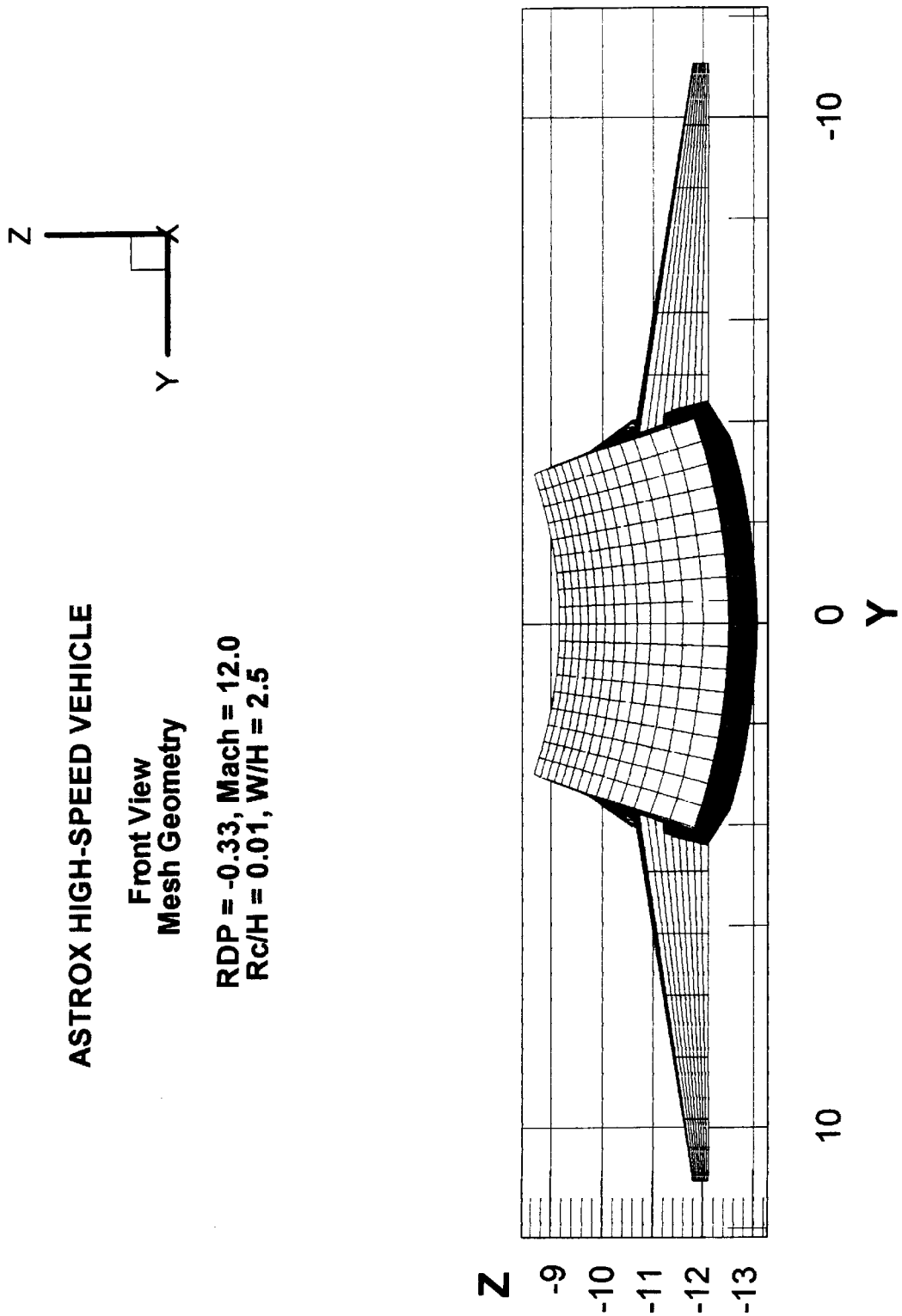
FIG. 27 shows a front mesh geometric view of an Astrox™ High-Speed Vehicle having a RDP value of −0.33 and a Rc/H value of 0.01.
Figure 28:
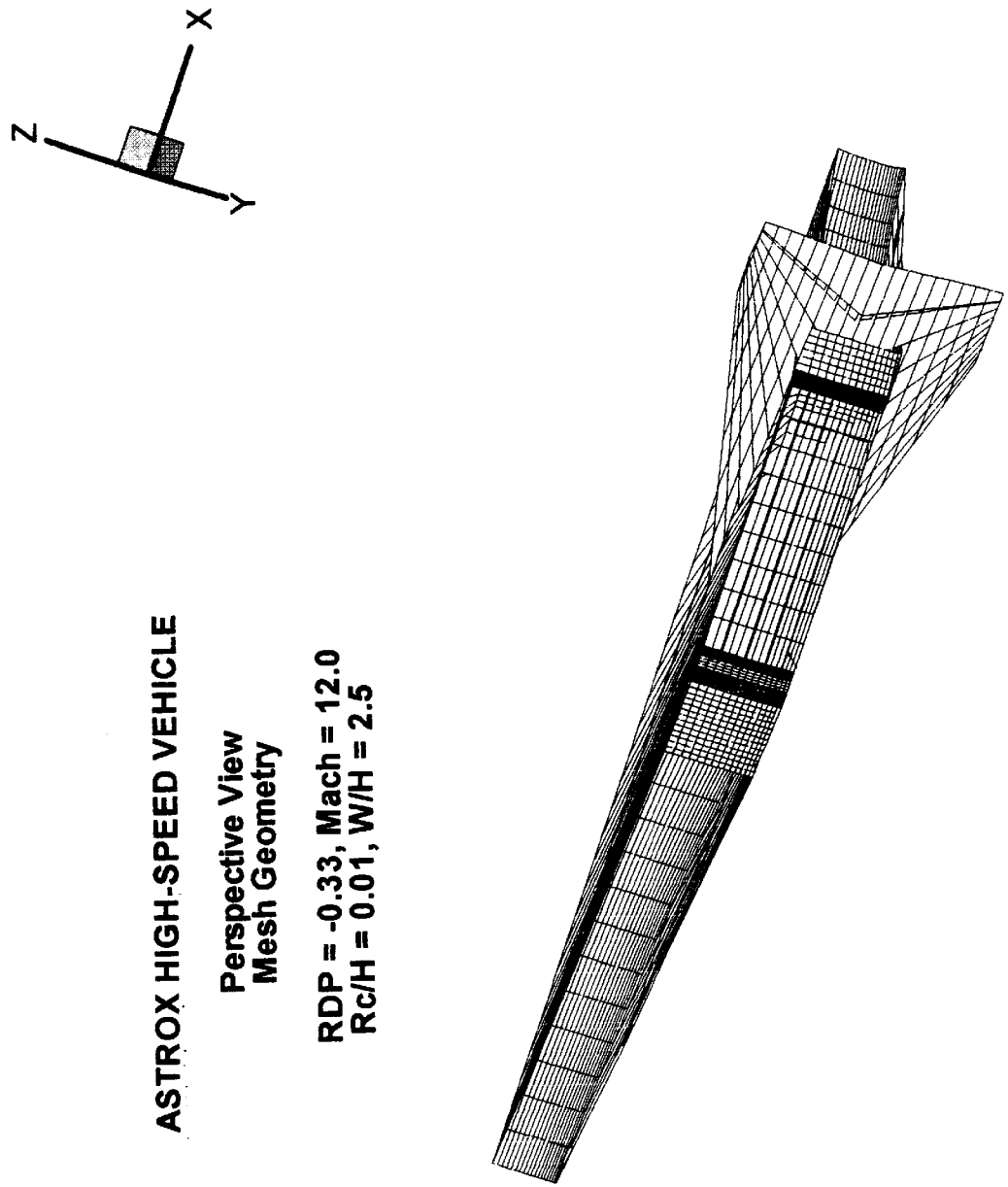
FIG. 28 shows a perspective mesh geometric view of an Astrox™ High-Speed Vehicle having a RDP value of −0.33 and a Rc/H value of 0.01.
Figure 29:
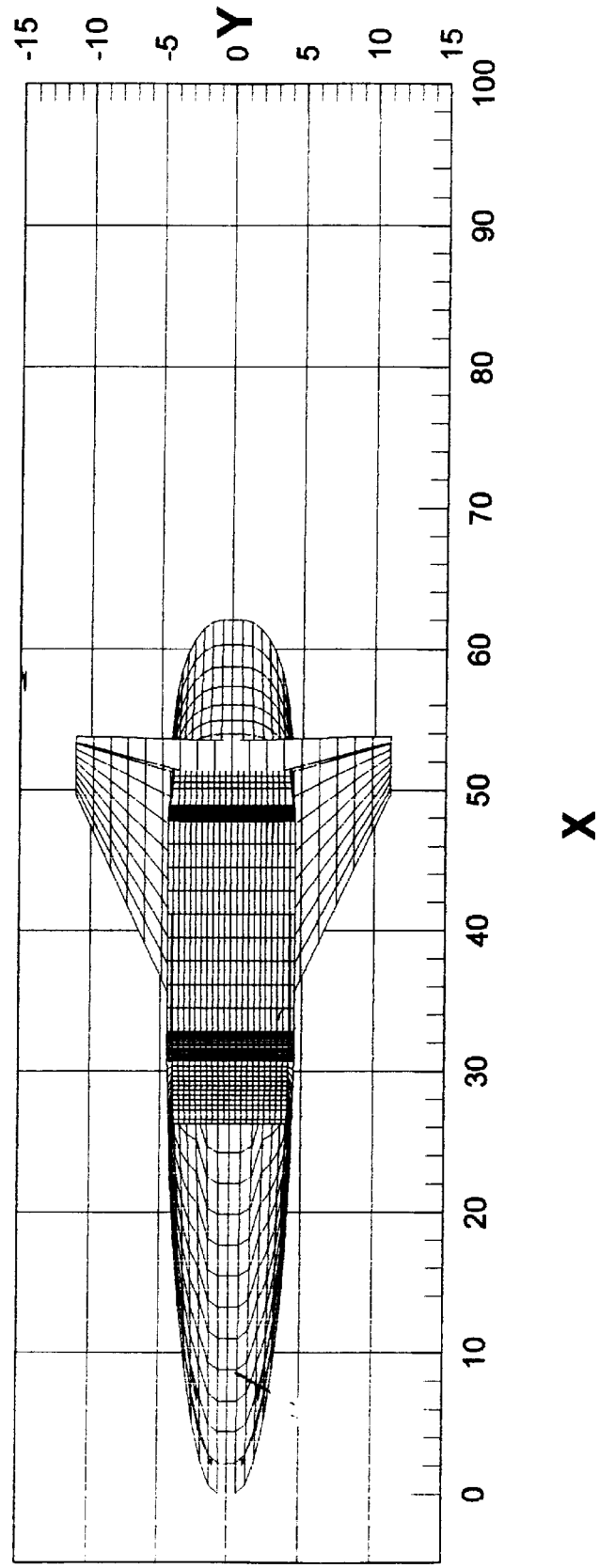
FIG. 29 shows a bottom mesh geometric view of an Astrox™ High-Speed Vehicle having a RDP value of −0.33 and a Rc/H value of 0.99.
Figure 30:
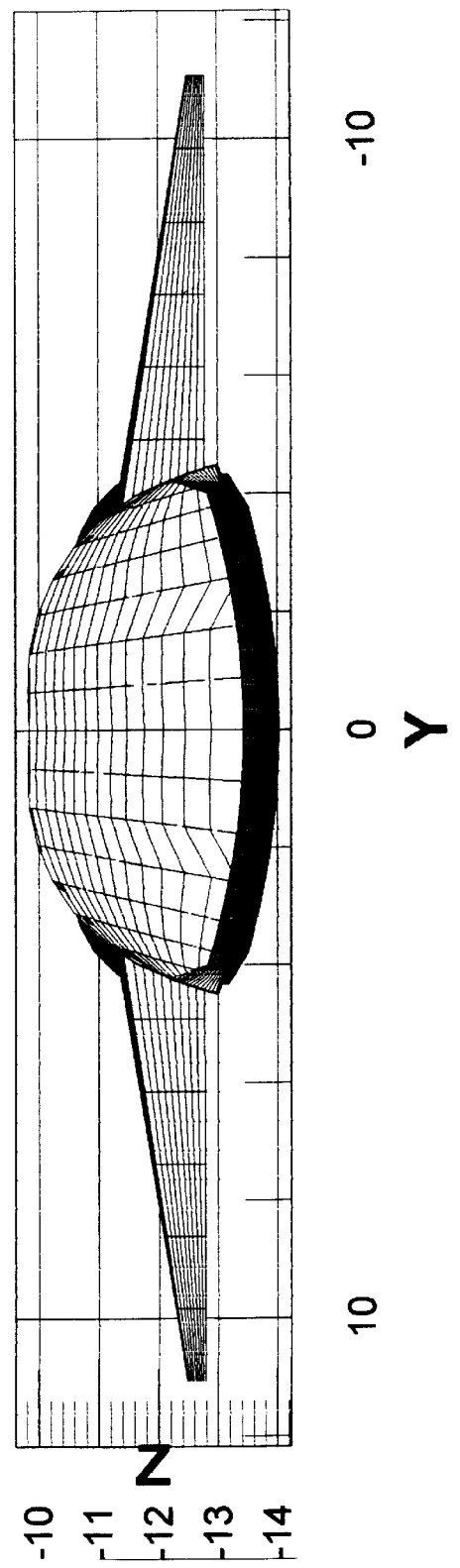
FIG. 30 shows a front mesh geometric view of an Astrox™ High-Speed Vehicle having a RDP value of −0.33 and a Rc/H value of 0.99.
Figure 32:
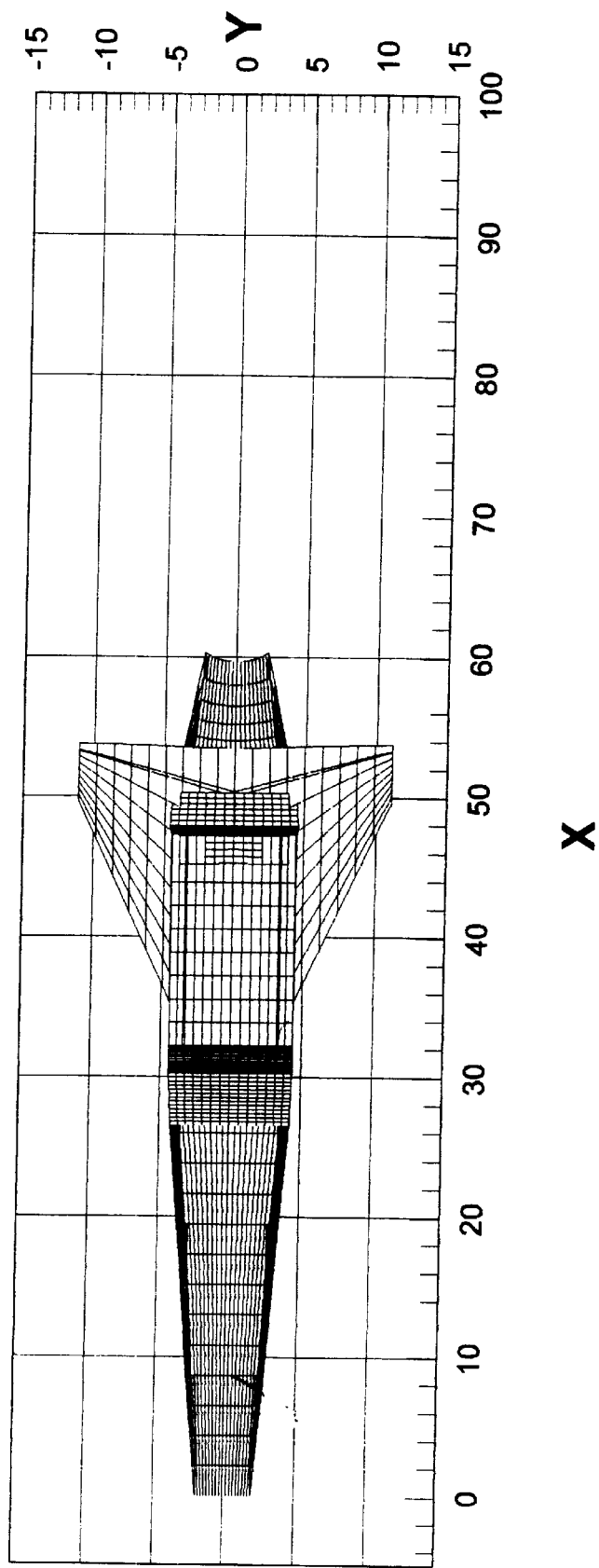
FIG. 32 shows a bottom mesh geometric view of an Astrox™ High-Speed Vehicle having a RDP value of −0.66 and a Rc/H value of 0.01.
Figure 33:
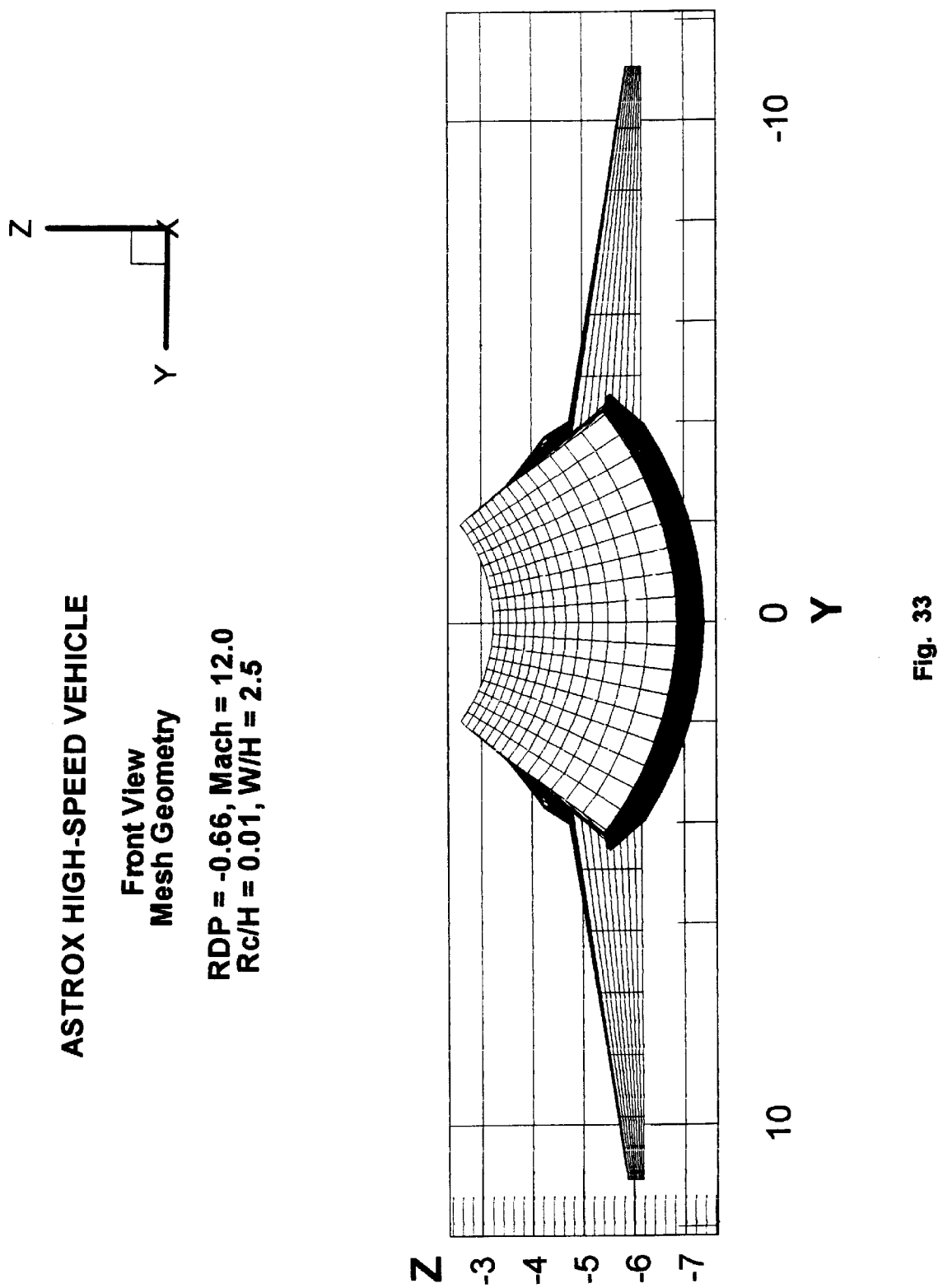
FIG. 33 shows a front mesh geometric view of an Astrox™ High-Speed Vehicle having a RDP value of −0.66 and a Rc/H value of 0.01.
Figure 35:
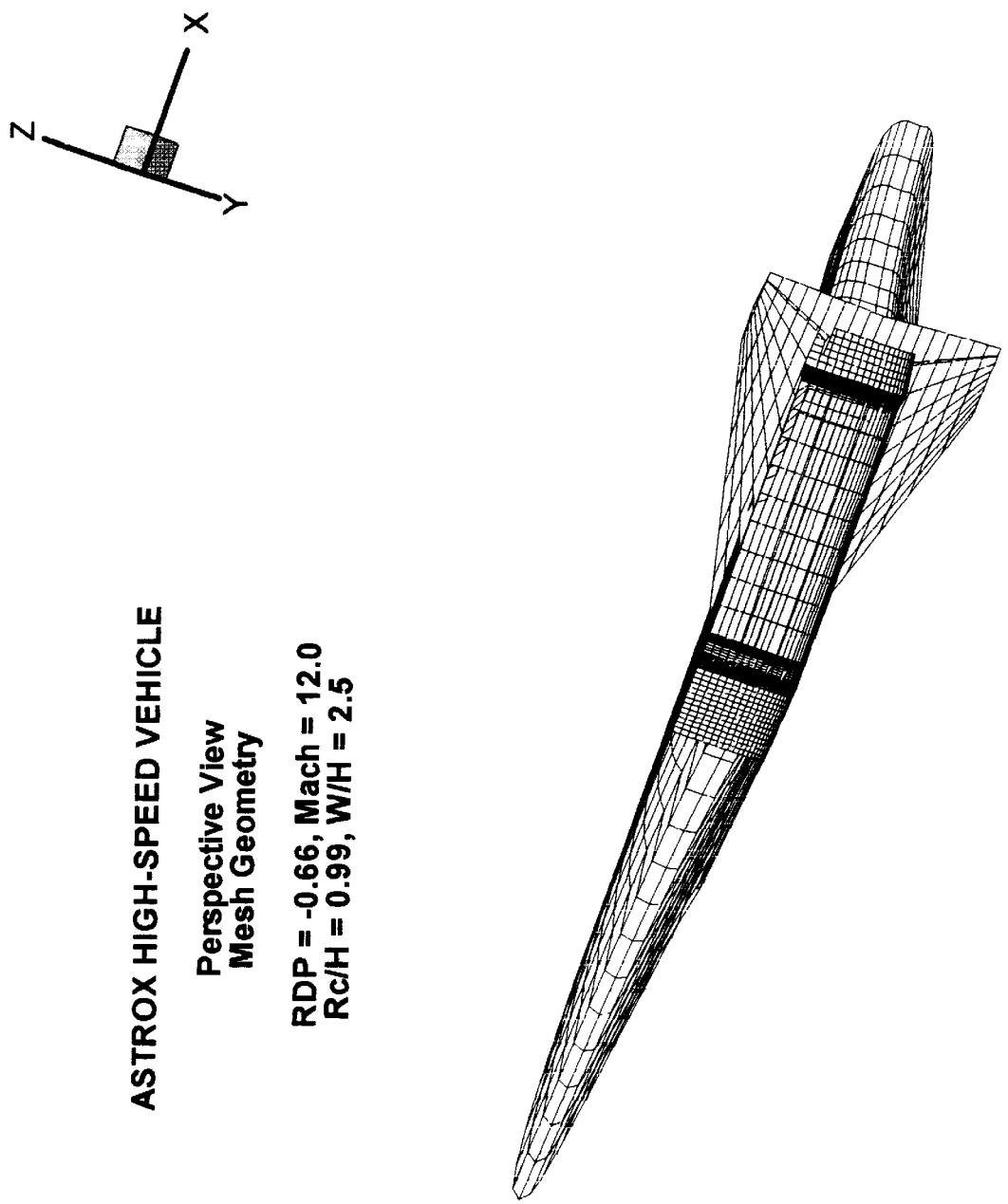
FIG. 35 shows a perspective mesh geometric view of an Astrox™ High-Speed Vehicle having a RDP value of −0.66 and a Rc/H value of 0.99.
Figure 36:
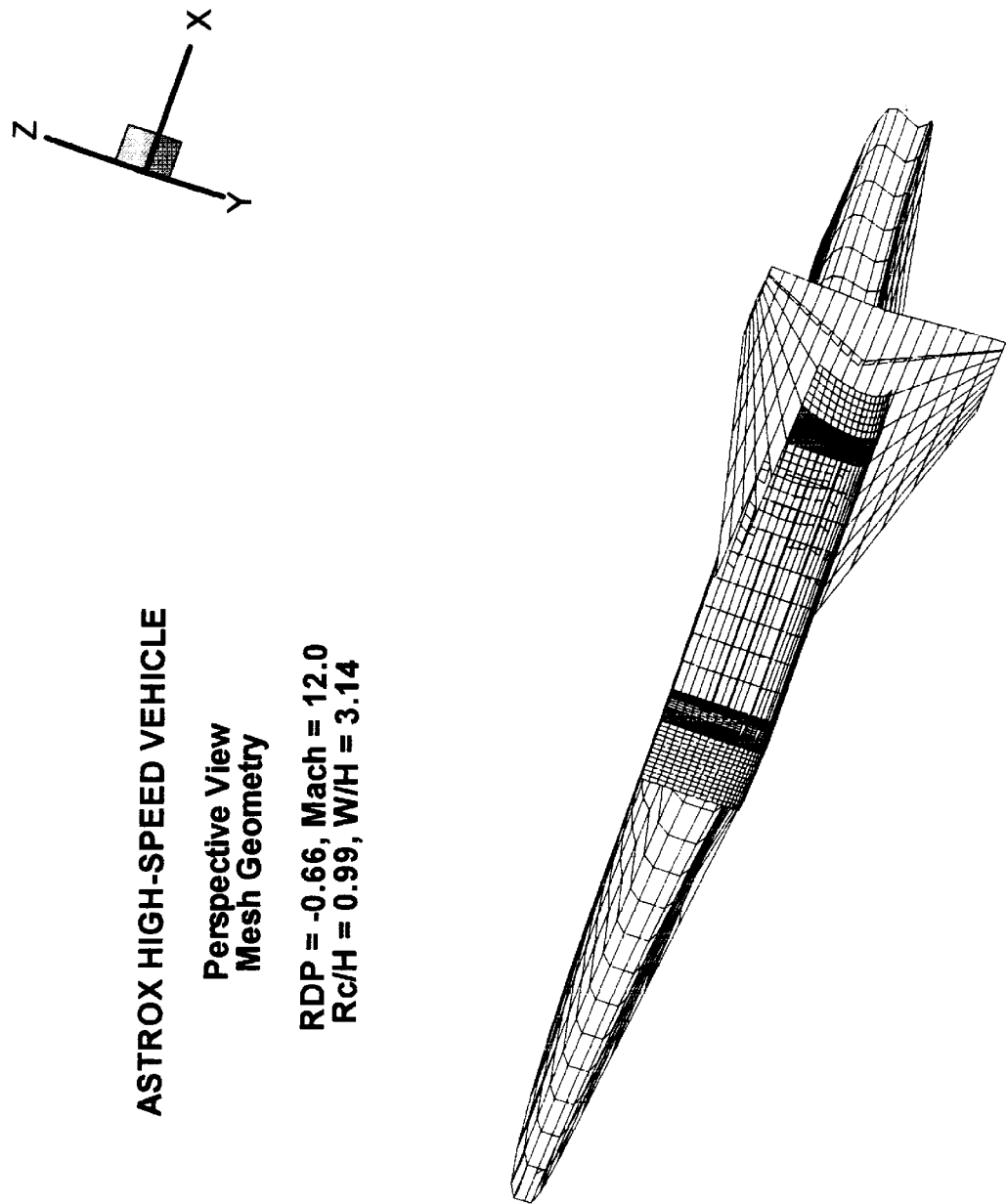
FIG. 36 shows a perspective mesh geometric view of an Astrox™ High-Speed Vehicle having a RDP value of −0.66, a Rc/H value of 0.99 and a W/H value of 3.14.
Figure 37:
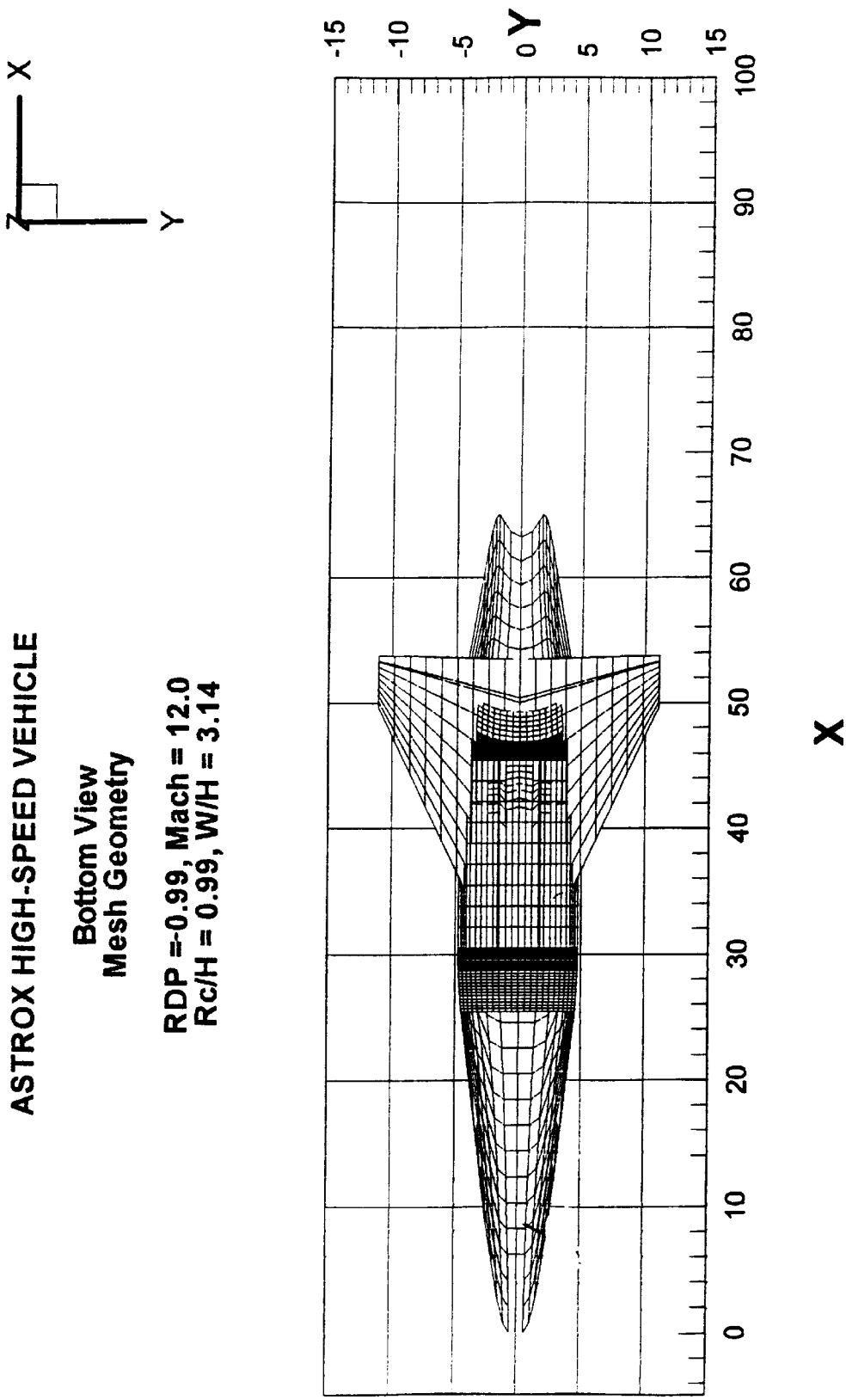
FIG. 37 shows a bottom mesh geometric view of an Astrox™ High-Speed Vehicle having a RDP value of −0.99 and a Rc/H value of 0.99.
Figure 38:
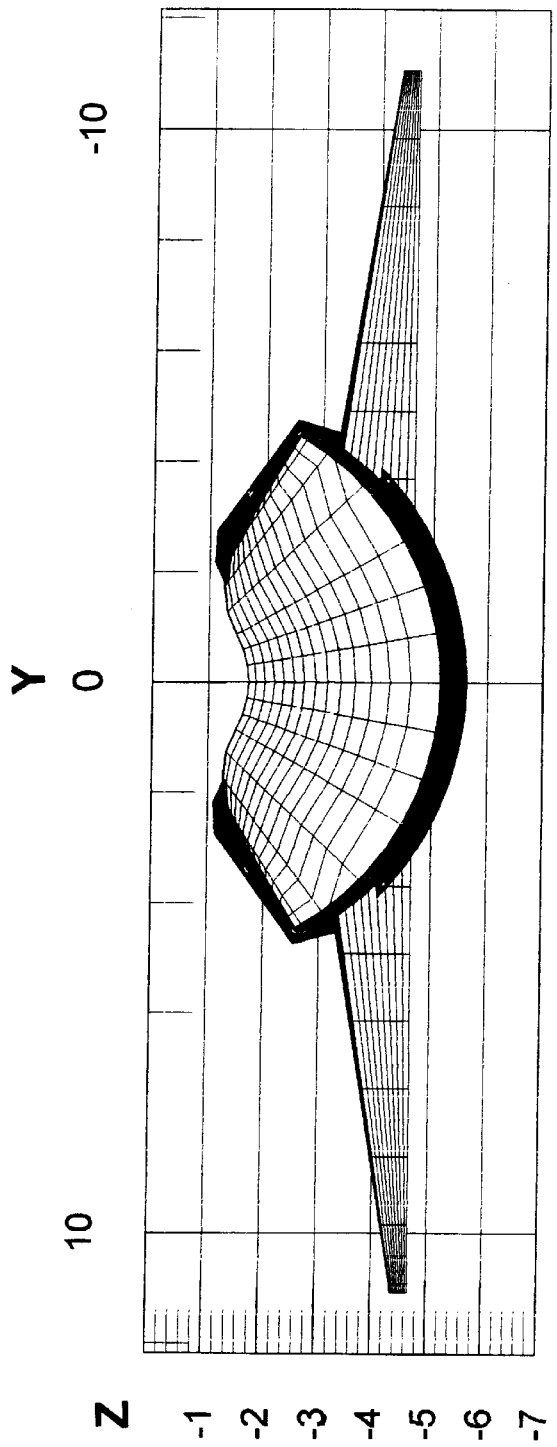
FIG. 38 shows a front mesh geometric view of an Astrox™ High-Speed Vehicle having a RDP value of −0.99 and a Rc/H value of 0.99.

FIG. 9 is the RDP=0.99 vehicle with Rc/H=0.01, M=12 and W/H=1.84. Various components are numbered (1 through 5) and named in the figure. Flow is from left-to-right. This is an inward turning vehicle. The advantages of such inward turning vehicles are described later in this document.

Of these vehicles, the inward turning vehicle (RDP=0.99) have several advantages as compared to the vehicles heretofore explored viz. 2–D (RDP=0.0) and outward turning (RDP=−1.0) vehicles. These are mentioned here and mentioned elsewhere in detail in this document. As can be seen, the combustor/isolator surface areas are substantially reduced as compared to the designs with a negative RDP value (shown in FIGS. 26–39). Since these are high heating areas requiring active cooling at hypersonic Mach numbers, a decrease in these areas translates to lower weights. Further since the vehicles generated at RDP=0.99 and Rc/H=0.99 produces a circular shaped combustor/isolator, it further reduces the primary structural weights in these areas since a circular shape have a higher tolerance for high combustor pressures than a rectangular or any other shape for that matter. This translates into lower wall thickness and hence lower weights for the same pressure stresses. Further, attempting additional internal compression by translating the forebody as opposed to moving the whole cowl up, down, forward and backward as was required for the 2–D NASP (National Aerospace Plane) or other hypersonic plane options heretofore designed, also reduces the sealing requirements substantially.

All of these and more numerous considerations promise this design to be the next generation of access-to-space or global reach hypersonic vehicles. These vehicles and their derivatives thereof promise to be the cheapest form of transportation to space. With the upcoming increase of commercial satellite launching needs (to about 1700 launches over the next 5 years) and a demand of space travel for pleasure and business, the present invention and designs thereof will revolutionize the technology of space travel.

The foregoing is merely illustrative of the principles of the invention. Those skilled in the art will be able to devise numerous arrangements, which, although not explicitly shown or described herein, nevertheless embody those principles that are within the spirit and scope of the invention.

I claim:

1. A computer implemented method of designing a space vehicle, comprising the steps of:
   determining a characteristic of a flow field;
   selecting a Radial Deviation Parameter numerical value consistent with the characteristic of the flow field;
   determining a shape of an inlet based on the Radial Deviation Parameter numerical value;
   determining a first exit property of the inlet;
   configuring a shape of an isolator based on the first exit property;
   determining a second exit property of the isolator;
   configuring a shape of a combustor based on the second exit property;
   determining a third exit property of the combustor;
   configuring a shape of a nozzle based on the third exit property;
   configuring an external surface based on the flow field;
   determining a lower wing and an upper wing based on a lifting characteristic provided by the flow field;
   displaying a graphical representation of the designed space vehicle.

2. The method of claim 1, wherein the flow field spreads inward as it travels toward an axis of revolution.

3. The method of claim 1, wherein the flow field spreads outward as it travels toward an axis of revolution.

4. The method of claim 1, wherein the flow field remains two dimensional as it travels toward an axis of revolution.

5. The method of claim 1, wherein the Radial Deviation Parameter numerical value is within the range of −1.0 and +1.0.

6. The method of claim 1 further comprises a step of optimizing the designed space vehicle.

7. A computer implemented design method of a space vehicle, comprising the steps of:
   inputting a Radial Deviation Parameter numerical value;
   inputting an inlet width-to-height ratio numerical value;
   inputting an inlet corner radius-to-height ratio numerical value;
   inputting a Mach-number numerical value;
   inputting a plurality of ambient atmospheric conditions;
   inputting a vehicle inlet capture area;
   determining an inlet configuration of the space vehicle based on the Radial Deviation Parameter numerical value, the inlet width-to-height ratio numerical value, the inlet corner radius-to-height ratio numerical value, and the Mach-number numerical value, the plurality of ambient atmospheric conditions and the vehicle inlet capture area; and
   displaying a graphical representation of the inlet configuration of the designed space vehicle.

8. The method of claim 7, wherein the Radiation Deviation Parameter numerical value is within a range of −1.0 and +1.0.

9. The method of claim 7 further comprises a step of determining a first exit property of the inlet based on the Radial Deviation Parameter numerical value.

10. The method of claim 9 further comprises a step of configuring a shape of an isolator based on the first exit property.

11. The method of claim 10 further comprises a step of determining a second exit property of the isolator.

12. The method of claim 11 further comprises a step of configuring a shape of a combustor based on the second exit property.

13. The method of claim 12 further comprises a step of determining a third exit property of the combustor.

14. The method of claim 13 further comprises a step of configuring a shape of a nozzle based on the third exit property.

15. The method of claim 14 further comprises a step of configuring an external surface and a flow-path geometry based on the Radial Deviation Parameter numerical value.

16. The method of claim 15 further comprises a step of configuring a lower wing and an upper wing based on a lifting characteristic of a flow field corresponding to the Radial Deviation Parameter numerical value.

17. The method of claim 7, wherein the Radial Deviation Parameter corresponds with a flow field spreading inward as it travels toward an axis of revolution.

18. The method of claim 7, wherein the Radial Deviation Parameter corresponds with a flow field spreading outward as it travels toward an axis of revolution.

19. The method of claim 7, wherein the Radial Deviation Parameter corresponds with a flow field remaining in two-dimensional form as it travels toward an axis of revolution.

20. A computer implemented method of designing a space vehicle, comprising the steps of:
   determining a characteristic of a flow field;
   inputting a Radial Deviation Parameter numerical value corresponding to the characteristic of the flow field;
   configuring an inlet of the space vehicle based on the Radial Deviation Parameter numerical value;
   displaying a graphical representation of the inlet of the designed space vehicle.

* * * * *

UNITED STATES PATENT AND TRADEMARK OFFICE
CERTIFICATE OF CORRECTION

| | | |
|---|---|---|
| PATENT NO. | : 6,164,596 | Page 1 of 1 |
| APPLICATION NO. | : 09/048080 | |
| DATED | : December 26, 2000 | |
| INVENTOR(S) | : Ajay P. Kothari | |

It is certified that error appears in the above-identified patent and that said Letters Patent is hereby corrected as shown below:

IN THE SPECIFICATION

Column 1, line 10, Please add --The U.S. Government has a paid-up license in the invention and the right in limited circumstances to require the patent owner to license others on reasonable terms as provided for by the terms of Small Business Innovative Research Phase II Contract No. F33615-95-C-2553 awarded by United States Air Force In July 1995.--

Column 7, lines 8 and 9, Please substitute "Further since" by --Since--.

Signed and Sealed this

Nineteenth Day of February, 2008

JON W. DUDAS
*Director of the United States Patent and Trademark Office*